United States Patent
Li et al.

(10) Patent No.: US 9,224,532 B2
(45) Date of Patent: Dec. 29, 2015

(54) ROLLED-UP INDUCTOR STRUCTURE FOR A RADIOFREQUENCY INTEGRATED CIRCUIT (RFIC)

(71) Applicant: The Board of Trustees of the University of Illinois, Urbana, IL (US)

(72) Inventors: Xiuling Li, Champaign, IL (US); Wen Huang, Champaign, IL (US); Placid M. Ferreira, Champaign, IL (US); Xin Yu, Urbana, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 54 days.

(21) Appl. No.: 14/051,188

(22) Filed: Oct. 10, 2013

(65) Prior Publication Data

US 2014/0103486 A1    Apr. 17, 2014

Related U.S. Application Data

(60) Provisional application No. 61/888,833, filed on Oct. 9, 2013, provisional application No. 61/818,689, filed on May 2, 2013, provisional application No. 61/712,360, filed on Oct. 11, 2012.

(51) Int. Cl.
*H01F 5/00* (2006.01)
*H01F 27/28* (2006.01)
(Continued)

(52) U.S. Cl.
CPC .............. *H01F 27/2804* (2013.01); *H01F 5/00* (2013.01); *H01F 5/02* (2013.01); *H01F 17/0013* (2013.01); *H01F 27/2847* (2013.01); *H01F 41/02* (2013.01); *H01F 41/041* (2013.01);
(Continued)

(58) Field of Classification Search
CPC .................. H01F 5/00; H01F 27/00–27/30

USPC ................... 336/65, 83, 200, 232, 192
See application file for complete search history.

(56) References Cited

U.S. PATENT DOCUMENTS 3,247,476 A * 4/1966 Pintell ........................ 336/177
4,755,783 A * 7/1988 Fleischer et al. ........... 336/84 C
(Continued)

FOREIGN PATENT DOCUMENTS

EP     2 423 162 A1    2/2012

OTHER PUBLICATIONS

Ali, M.S. Mohamed et al., "Out-of-plane spiral-coil inductor self-assembled by locally controlled bimorph actuation," *Micro & Nano Letters*, 6, 12 (2011) pp. 1016-1018.
(Continued)

*Primary Examiner* — Tuyen Nguyen
(74) *Attorney, Agent, or Firm* — Brinks & Gilson & Lione

(57) ABSTRACT

A rolled-up inductor structure for a radiofrequency integrated circuit (RFIC) comprises a multilayer sheet in a rolled configuration comprising multiple turns about a longitudinal axis. The multilayer sheet comprises a conductive pattern layer on a strain-relieved layer, and the conductive pattern layer comprises at least one conductive strip having a length extending in a rolling direction. The at least one conductive strip thereby wraps around the longitudinal axis in the rolled configuration. The conductive pattern layer may also comprise two conductive feed lines connected to the conductive strip for passage of electrical current therethrough. The conductive strip serves as an inductor cell of the rolled-up inductor structure.

20 Claims, 16 Drawing Sheets

(51) Int. Cl.
H01F 5/02 (2006.01)
H01F 41/02 (2006.01)
H01L 49/02 (2006.01)
H01F 41/06 (2006.01)
H01L 23/64 (2006.01)
H01L 21/48 (2006.01)
H01L 23/66 (2006.01)
H01F 17/00 (2006.01)
H01F 41/04 (2006.01)
H01L 23/522 (2006.01)

(52) U.S. Cl.
CPC ........ *H01F41/0604* (2013.01); *H01L 21/4814* (2013.01); *H01L 23/5227* (2013.01); *H01L 23/645* (2013.01); *H01L 23/66* (2013.01); *H01L 28/10* (2013.01); *H01F 2017/006* (2013.01); *H01F 2027/2809* (2013.01); *H01F 2027/2857* (2013.01); *H01L 2223/6627* (2013.01); *H01L 2223/6677* (2013.01); *H01L 2924/0002* (2013.01); *Y10T 29/49071* (2015.01)

(56) References Cited

U.S. PATENT DOCUMENTS

| | | | |
|---|---|---|---|
| 5,844,460 A * | 12/1998 | Bogdan et al. | 336/177 |
| 7,330,096 B2 * | 2/2008 | Shah et al. | 336/58 |
| 7,707,714 B2 | 5/2010 | Schmidt et al. | |
| 7,710,232 B1 * | 5/2010 | Stalford et al. | 336/192 |
| 2010/0019868 A1 * | 1/2010 | Hyde et al. | 333/219 |

OTHER PUBLICATIONS

Arora, William J. et al., "Membrane folding to achieve three-dimensional nanostructures: Nanopatterned silicon nitride folded with stressed chromium hinges," *Applied Physics Letters*, 88, 053108 (2006) pp. 053108-1-053108-3.
Bianucci, P. et al., "Self-Organized 1.55 μm InAs/InP Quantum Dot Tube Nanoscale Coherent Light Sources," *Winter Topicals (WTM) IEEE, Conference Publication* (2011), pp. 127-128.
Bof Bufon, Carlos César et al., "Self-Assembled Ultra-Compact Energy Storage Elements Based on Hybrid Nanomembranes," *Nano Letters*, 10 (2010) pp. 2506-2510.
Bogush, V. et al., "Electroless deposition of novel Ag-W thin films," *Microelectronic Engineering*, 70 (2003) pp. 489-494.
Chen, Daru et al., "A novel low-loss Terahertz waveguide: Polymer tube," *Optics Express*, 18, 4 (2010) pp. 3762-3767.
Chun, Ik Su et al., "Controlled Assembly and Dispersion of Strain-Induced InGaAs/GaAs Nanotubes," *IEEE Transactions on Nanotechnology*, 7, 4 (2008) pp. 493-495.
Chun, I.S. et al., "InGaAs/GaAs 3D architecture formation by strain-induced self-rolling with lithographically defined rectangular stripe arrays," *Journal of Crystal Growth*, 310 (2008) pp. 2353-2358.
Chun, Ik Su et al., "Geometry Effect on the Strain-Induced Self-Rolling of Semiconductor Membranes," *Nano Letters*, 10 (2010) pp. 3927-3932.
Dai, Lu et al., "Directional scrolling of SiGe/Si/Cr nanoribbon on Si(111) surfaces controlled by two-fold rotational symmetry underetching," *Nanoscale*, 5 (2013) pp. 971-976.
Dai, L. et al., "Strain-driven self-rolling mechanism for anomalous coiling of multilayer nanohelices," *Journal of Applied Physics*, 106, 114314 (2009) pp. 114314-1-114314-5.
Doerner, M. et al., "Stresses and Deformation Processes in Thin Films on Substrates," *CRC Critical Reviews in a Solid State and Materials Sciences*, 14, 3 (1988) pp. 224-268.
Du, Frank et al., "Aligned arrays of single walled carbon nanotubes for transparent electronics," *Proceedings of SPIE*, 8725 (2013) pp. 87251S-1-87251S-7.
Frankel, Michael Y., "Terahertz Attenuation and Dispersion Characteristics of Coplanar Transmission Lines," *IEEE Transactions on Microwave Theory and Techniques*, 39, 6 (1991), pp. 910-916.

Golod, S. V. et al., "Fabrication of conducting GeSi/Si micro- and nanotubes and helical microcoils," *Semiconductor Science and Technology*, 16 (2001) pp. 181-185.
Golod, S.V. et al., "Freestanding SiGe/Si/Cr and SiGe/Si/Si$_x$N$_y$/Cr Microtubes," *Applied Physics Letters*, 84, 17 (2004) pp. 3390-3393.
Gorin, A. et al., "Fabrication of silicon nitride waveguides for visible-light using PECVD: a study of the effect of plasma frequency on optical properties," *Optics Express*, 16, 18 (2008) pp. 13509-13516.
Harazim, Stefan M. et al., "Fabrication and applications of large arrays of multifunctional rolled-up SiO/SiO$_2$ microtubes," *Journal of Materials Chemistry*, 22, 7 (2012) pp. 2878-2884.
Heiliger, H.-M. et al., "Low-dispersion thin-film microstrip lines with cyclotene (benzocyclobutene) as dielectric medium," *Applied Physics Letters*, 70, 17 (1997) pp. 2233-2235.
Huang, G. S. et al., "Optical properties of rolled-up tubular microcavities from shaped nanomembranes," *Applied Physics Letters*, 94, 141901 (2009) 141901-1-141901-3.
Huang, Minghuang et al., "Nanomechanical Architecture of Strained Bilayer Thin Films: From Design Principles to Experimental Fabrication," *Advanced Materials*, 17 (2005) pp. 2860-2864.
Huang, Gaoshan et al., "Thinning and Shaping Solid Films into Functional and Integrative Nanomembranes," *Advanced Materials*, 24 (2012) pp. 2517-2546.
Huang, Gaoshan et al., "Rolled-up transparent microtubes as two-dimensionally confined culture scaffolds of individual yeast cells," *Lab Chip*, 9 (2009) pp. 263-268.
Huang, Minghuang et al., "Mechano-electronic Superlattices in Silicon Nanoribbons," *ACS Nano*, 3, 3 (2009) pp. 721-727.
Inberg, A. et al., "Novel Highly Conductive Silver-Tungsten Thin Films Electroless Deposited from Benzoate Solution for Microelectronic Applications," *Journal of The Electrochemical Society*, 150, 5 (2003) pp. C285-C291.
Ishigaki, Tsukasa et al., "Photonic-Crystal Slab for Terahertz-Wave Integrated Circuits," *Photonics Conference (IPC) IEEE, Conference Publication* (2012) pp. 774-775.
Jan, C.-H. et al., "A 32nm SoC Platform Technology with $2^{nd}$ Generation High-k/Metal Gate Transistors Optimized for Ultra Low Power, High Performance, and High Density Product Applications," *IEEE*, (2009) pp. 647-650.
Jiang, Hongrui et al., "On-Chip Spiral Inductors Suspended over Deep Copper-Lined Cavities," *IEEE Transactions on Microwave Theory and Techniques*, 48, 12 (2000) pp. 2415-2423.
Li, Feng et al., "Coherent emission from ultrathin-walled spiral InGaAs/GaAs quantum dot microtubes," *Optics Letters*, 34, 19 (2009) pp. 2915-2917.
Li, Weizhi et al., "Influences of Process Parameters of Low Frequency PECVD Technology on Intrinsic Stress of Silicon Nitride Thin Film," *Proc. of SPIE*, 7658 (2010) pp. 765824-1-765824-7.
Li, Xiuling, "Self-rolled-up microtube ring resonators: a review of geometrical and resonant properties," *Advances in Optics and Photonics*, 3 (2011) pp. 366-387.
Li, Xiuling, "Strain induced semiconductor nanotubes: from formation process to device applications," *Journal of Physics D: Applied Physics*, 41 (2008) 193001, pp. 1-12.
Logeeswaran, V. J. et al., "Ultrasmooth Silver Thin Films Deposited with a Germanium Nucleation Layer," *Nano Letters*, 9, 1 (2009) pp. 178-182.
Luchnikov, V. et al., "Toroidal hollow-core microcavities produced by self-rolling of strained polymer bilayer films," *Journal of Micromechanics and Microengineering*, 18 (2008) 035041, pp. 1-5.
Luo, J. K. et al., "Modelling and fabrication of low operation temperature microcages with a polymer/metal/DLC trilayer structure," *Sensors and Actuators A*, 132 (2006) pp. 346-353.
Masi, Maurizio et al., "Modeling of Silicon Nitride Deposition by RF Plasma-Chemical Vapor Deposition," *Chemical Engineering Science*, 49, 5 (1994) pp. 669-679.
Mei, Yongfeng et al., "Versatile Approach for Integrative and Functionalized Tubes by Strain Engineering of Nanomembranes on Polymers," *Advanced Materials*, 20 (2008) pp. 4085-4090.
Mi, Zetian et al., "1.3-1.55 μm Self-Organized InAs Quantum Dot Tube Nanoscale Lasers on Silicon," *Photonics Conference (PHO), IEEE, Conference Publication* (2011) pp. 535-536.

(56) References Cited

OTHER PUBLICATIONS

Mitrofanov, Oleg et al., "Reducing Transmission Losses in Hollow THz Waveguides," *IEEE Transactions on Terahertz Science and Technology*, 1, 1 (2011) pp. 124-132.

Mitrofanov, Oleg et al., "Dielectric-lined cylindrical metallic THz waveguides: mode structure and dispersion," *Optics Express*, 18, 3 (2010) pp. 1898-1903.

Moiseeva, E. et al., "Single-mask microfabrication of three-dimensional objects from strained bimorphs," *Journal of Micromechanics and Microengineering*, 17 (2007) pp. N63-N68.

Müller, Christian et al., "Tuning giant magnetoresistance in rolled-up Co—Cu nanomembranes by strain engineering," *Nanoscale*, 4 (2012) pp. 7155-7160.

Nguyen, Nhat M. et al., "Si IC-Compatible Inductors and LC Passive Filters," *IEEE Journal of Solid-State Circuits*, 25, 4 (1990) pp. 1028-1031.

Pahlevaninezhad, H. et al., "Advances in Terahertz Waveguides and Sources," *IEEE Photonics Journal*, 3, 2 (2011) pp. 307-310.

Pang, Liang et al., "Transfer printing of flexible hybrid inductor-capacitor filters via pre-etched silicon-on-insulator mother wafer," *Applied Physics Letters*, 101, 063113 (2012) pp. 063113-1-063113-4.

Park, Min et al., "The Detailed Analysis of High Q CMOS-Compatible Microwave Spiral Inductors in Silicon Technology," *IEEE Transactions on Electron Devices*, 45, 9 (1998) pp. 1953-1959.

Parvizian, M. et al., "Residual stress improvement of platinum thin film in Au/Pt/Ti/p-GaAs ohmic contact by RF sputtering power," *Applied Surface Science*, 260 (2012) pp. 77-79.

Prinz, V. Ya. et al., "Free-standing and overgrown InGaAs/GaAs nanotubes, nanohelices and their arrays," *Physica E*, 6 (2000) pp. 828-831.

Rottler, Andreas et al., "Rolled-up nanotechnology for the fabrication of three-dimensional fishnet-type GaAs-metal metamaterials with negative refractive index at near-infrared frequencies," *Applied Physics Letters*, 100, 151104 (2012) pp. 151104-1-151104-4.

Schulze, Sabine et al., "Morphological Differentiation of Neurons on Microtopographic Substrates Fabricated by Rolled-Up Nanotechnology," *Advanced Engineering Materials*, 12, 9 (2010), pp. B558-B564.

Seidel, H. et al., "Anisotropic Etching of Crystalline Silicon in Alkaline Solutions," *J. Electrochem. Soc.*, 137, 11 (1990) pp. 3612-3632.

Seleznev, V. A. et al., "Generation and Registration of Disturbances in a Gas Flow. 1. Formation of Arrays of Tubular Microheaters and Microsensors," *Journal of Applied Mechanics and Technical Physics*, 50, 2 (2009) pp. 291-296.

Shacham-Diamand, Yosi et al., "Electroless Silver and Silver with Tungsten Thin Films for Microelectronics and Microelectromechanical System Applications," *Journal of The Electrochemical Society*, 147, 9 (2000) pp. 3345-3349.

Shiplyuk, A. N. et al., "Generation and Registration of Disturbances in a Gas Flow. 2. Experiments with Arrays of Tubular Microheaters and Microsensors," *Journal of Applied Mechanics and Technical Physics*, 50, 3 (2009) pp. 454-458.

Smith, Donald L. et al., "Mechanism of $SiN_xH_y$ Deposition from $NH_3$-$SiH_4$ Plasma," *J. Electrochem. Soc.*, 137, 2 (1990) pp. 614-623.

Smith, Elliot J. et al., "Lab-in-a-Tube: Detection of Individual Mouse Cells for Analysis in Flexible Split-Wall Microtube Resonator Sensors," *Nano Letters*, 11 (2011) pp. 4037-4042.

Songmuang, R. et al., "From rolled-up Si microtubes to $SiO_x$/Si optical ring resonators," *Microelectronic Engineering*, 84 (2007) pp. 1427-1430.

Tang, Chih-Chun et al., "Miniature 3-D Inductors in Standard CMOS Process," *IEEE Journal of Solid-State Circuits*, 37, 4 (2002) pp. 471-480.

Tian, Dongbin et al., "Dual cylindrical metallic grating-cladding polymer hollow waveguide for terahertz transmission with low loss," *Applied Physics Letters*, 97, (2010) pp. 133502-1-133502-3.

Tian, Zhaobing et al., "Controlled Transfer of Single Rolled-Up InGaAs-GaAs Quantum-Dot Microtube Ring Resonators Using Optical Fiber Abrupt Tapers," *IEEE Photonics Technology Letters*, 22, 5 (2010) pp. 311-313.

Tian, Zhaobing et al., "Single rolled-up InGaAs/GaAs quantum dot microtubes integrated with silicon-on-insulator waveguides," *Optics Express*, 19, 13 (2011) pp. 12164-12171.

Timoshenko, S., "Analysis of Bi-Metal Thermostats," *Journal of the Optical Society of America*, 11 (1925) pp. 233-255.

Walmsley, Byron A. et al., "Poisson's Ratio of Low-Temperature PECVD Silicon Nitride Thin Films," *Journal of Microelectromechanical Systems*, 16, 3 (2007) pp. 622-627.

Wang, To-Po et al., "High-Q Micromachined Inductors for 10-to-30-GHz RFIC Applications on Low Resistivity Si-Substrate," *Proceedings of the 36th European Microwave Conference*, (2006) pp. 56-59.

Wheeler, Harold A., "Formulas for the Skin Effect," *Proceedings of the I.R.E.*, (1942) pp. 412-424.

Wiemer, L. et al., "Determination of Coupling Capacitance of Underpasses, Air Bridges and Crossings in MICs and MMICs," *Electronics Letters*, 23, 7 (1987) pp. 344-346.

Xu, Xiangdong et al., "Chemical Control of Physical Properties in Silicon Nitride Films," *Appl. Phys. A.*, 111 (2013) pp. 867-876.

Yue, C. Patrick et al., "A Physical Model for Planar Spiral Inductors on Silicon," *IEEE, IEDM*, 96 (1996) pp. 155-158.

Yue, C. Patrick et al., "Physical Modeling of Spiral Inductors on Silicon," *IEEE Transactions on Electron Devices*, 47, 3 (2000) pp. 560-568.

Yu, Minrui et al., "Semiconductor Nanomembrane Tubes: Three-Dimensional Confinement for Controlled Neurite Outgrowth," *ACS Nano*, 5, 4 (2011) pp. 2447-2457.

Zang, Ji et al., "Mechanism for Nanotube Formation from Self-Bending Nanofilms Driven by Atomic-Scale Surface-Stress Imbalance," *Physical Review Letters*, 98, (2007) pp. 146102-1-146102-4.

Zolfaghari, Alireza et al., "Stacked Inductors and Transformers in CMOS Technology," *IEEE Journal of Solid-State Circuits*, 36, 4 (2001) pp. 620-628.

\* cited by examiner

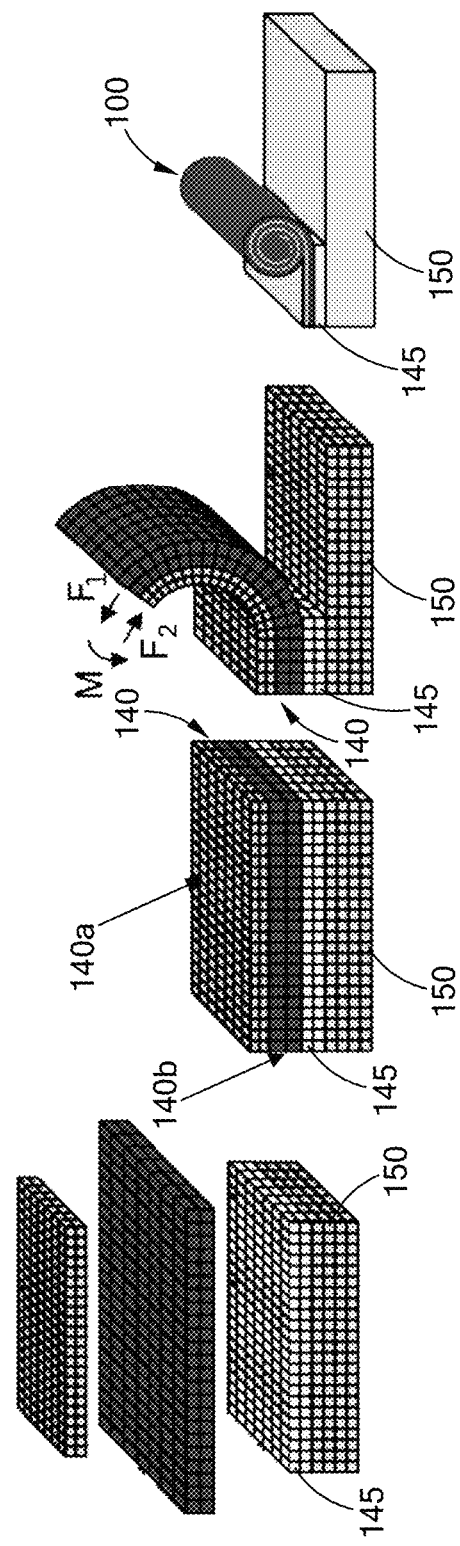

US 9,224,532 B2

ROLLED-UP INDUCTOR STRUCTURE FOR A RADIOFREQUENCY INTEGRATED CIRCUIT (RFIC)

RELATED APPLICATIONS

The present patent document claims the benefit of priority under 35 U.S.C. 119(e) to U.S. Provisional Patent Application Ser. No. 61/888,833, filed on Oct. 9, 2013, to U.S. Provisional Patent Application Ser. No. 61/818,689, filed on May 2, 2013, and to U.S. Provisional Patent Application Ser. No. 61/712,360, filed on Oct. 11, 2012, all of which are hereby incorporated by reference in their entirety.

Also incorporated by reference in their entirety are the U.S. nonprovisional patent applications entitled "Rolled-up Transformer Structure for a Radiofrequency Integrated Circuit (RFIC)," and "Rolled-up Transmission Line Structure for a Radiofrequency Integrated Circuit (RFIC)," which have the same filing date, Oct. 10, 2013, as the present patent document and which also claim priority to the above-mentioned provisional patent applications.

FEDERALLY SPONSORED RESEARCH OR DEVELOPMENT

This invention was made with government support under award numbers ECCS 0747178 and 1309375 from the National Science Foundation, DE-FG02-07ER46471 from the Department of Energy, and N000141110634 from the Office of Naval Research. The government has certain rights in the invention.

TECHNICAL FIELD

The present disclosure is directed generally to on-chip device structures and more particularly to non-planar inductor structures.

BACKGROUND

On-chip inductors have widespread applications in radiofrequency integrated circuits (RFICs). Planar spiral inductors are the most commonly used on-chip inductors in current RFIC designs due to ease of fabrication with standard CMOS processes, which, at the same time, limit the design to a two-dimensional (2D) wafer surface. Conventional planar spiral inductors utilize self and mutual electromagnetic coupling of long parallel wires to achieve high inductance. For example, a 10 nH planar spiral inductor usually takes up to about 400×400 $\mu m^2$ on-wafer area with a typical maximum quality (Q) factor of about 6 at frequencies lower than 3 GHz and a self-resonance frequency of about 10 GHz. The large footprint introduces significant parasitic coupling capacitance and ohmic loss from the substrate, which are the two main reasons for the low Q factor and resonance frequency.

Efforts have been made for a long time to shrink the size and maintain or improve the performance of on-chip planar spiral inductors. For example, stacked planar spiral inductors were reported to occupy an area about 16% of that of conventional ones at a similar value of inductance. Suspended MEMS spiral inductors with a Q factor as high as 20 at a frequency over 10 GHz have been demonstrated. Three dimensional (3D) spiral coil inductors, with a tunable inductance independent of their base dimensions, have been shown to have a Q factor as high as 17 through metal deformation driven by thermal stress. Intel achieved high Q factors greater than 20 using planar inductors having a footprint compatible with the 32 nm and beyond system on chip (SoC) platform, but had to resort to a very thick, low-resistivity top metal layer (4-7 μm). All of these approaches addressed only some aspects of the shortcomings of planar spiral inductors.

BRIEF SUMMARY

A novel, rolled-up inductor structure has been developed to overcome the shortcomings of current planar devices used in RFICs.

The rolled-up inductor structure comprises a multilayer sheet in a rolled configuration comprising multiple turns about a longitudinal axis. The multilayer sheet comprises a conductive pattern layer on a strain-relieved layer, and the conductive pattern layer comprises at least one conductive strip having a length extending in a rolling direction. The at least one conductive strip thereby wraps around the longitudinal axis in the rolled configuration. The conductive pattern layer also comprises two conductive feed lines connected to the at least one conductive strip for passage of electrical current therethrough. The conductive strip serves as an inductor cell of the rolled-up inductor structure.

A method of making such a rolled-up inductor structure includes forming a sacrificial layer on a substrate, and forming a strained layer on the sacrificial layer, where the strained layer comprises an upper portion under tensile stress and a lower portion under compressive stress. The strained layer is held on the substrate by the sacrificial layer. A conductive pattern layer is formed on the strained layer, where the conductive pattern layer comprises at least one conductive strip having a length extending in a rolling direction, the at least one conductive strip thereby wrapping around the longitudinal axis in the rolled configuration; and two conductive feed lines connected to the at least one conductive strip for passage of electrical current therethrough. Removal of the sacrificial layer from the substrate is initiated, thereby releasing an end of the strained layer, and the removal of the sacrificial layer is continued, thereby allowing the strained layer to move away from the substrate and roll up to relieve strain in the strained layer. The conductive pattern layer adheres to the strained layer during the roll-up, and a rolled-up inductor structure is formed. After the roll-up, the at least one conductive strip wraps around the longitudinal axis and serves as an inductor cell of the rolled-up inductor structure.

BRIEF DESCRIPTION OF THE DRAWINGS

FIGS. 1A-1B show an exemplary strained bilayer comprising a top sublayer in tension and a bottom sublayer in compression deposited on a sacrificial layer on a substrate, and FIGS. 1C-1D show schematically the release and subsequent roll-up of the bilayer from the underlying sacrificial layer.

FIG. 6A shows effective inductance $L_{e\_total}$ versus operating frequency, and FIG. 6B shows corresponding Q factor $Q_{total}$ versus operating frequency. The metal strip is assumed to be 100 nm thick and 15 μm wide Ag, and the inner diameter of the rolled-up tube is assumed to be 3 μm (with a 40 nm-thick $SiN_x$ membrane (sheet)), and the separation distance between each cell is 15 μm.

DETAILED DESCRIPTION

Figure 2A:
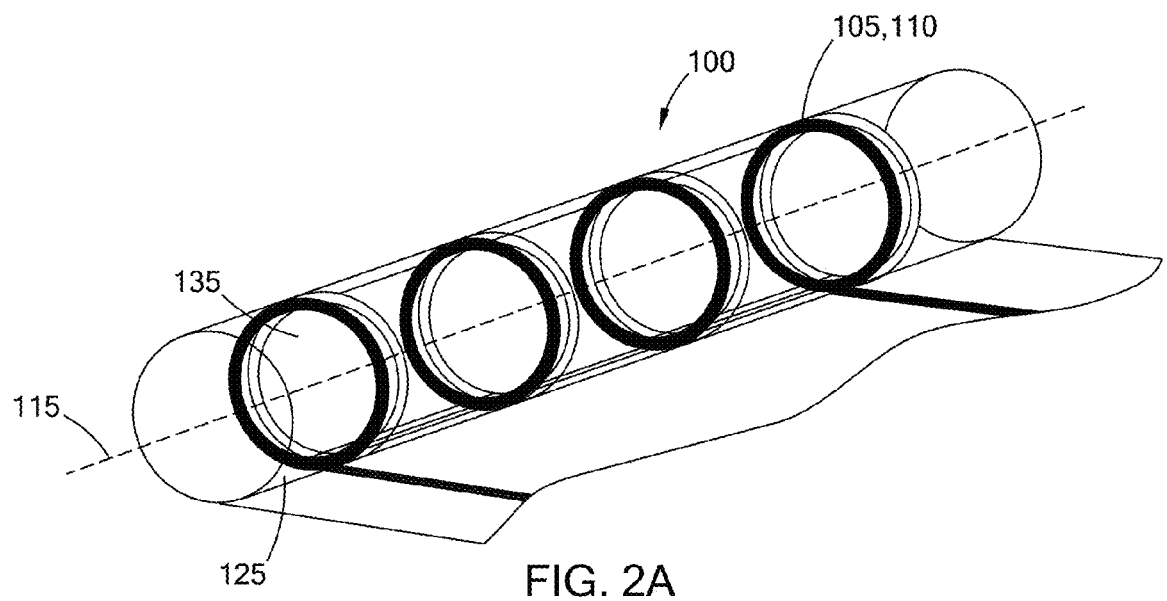
FIGS. 2A and 2B show a perspective view and a top view of an exemplary rolled up inductor.

Described herein are three-dimensional (3D) inductor structures formed in a self-rolling process that may have a greatly reduced on-chip footprint and significant performance improvement in RFICs. Such transformer structures have a carefully designed planar structure that is engineered to impart the desired dimensions and functionality upon roll-up.

FIGS. 1A-1D provide an introduction to the self-rolling concept. Rolled-up micro- and nanotubular device structures form spontaneously when strained planar sheets or membranes deform as a consequence of energy relaxation. A strained membrane may include a conductive pattern layer on an oppositely strained bilayer 140 (e.g., a top layer 140a in tension on a bottom layer 140b in compression), which is in contact with a sacrificial interlayer 145 on a substrate 150. The oppositely strained bilayer 140 may be released from the substrate 150 when the sacrificial layer 145 is etched away. Once released, the opposing strain within the bilayer 140 generates a net momentum, driving the planar membrane to scroll up and continue to roll into a tubular spiral structure 100. The metal layer itself, which is illustrated in the examples of FIGS. 2A and 2B, can also provide additional residual stress (e.g., tensile stress) to facilitate rolling.

Figure 2B:
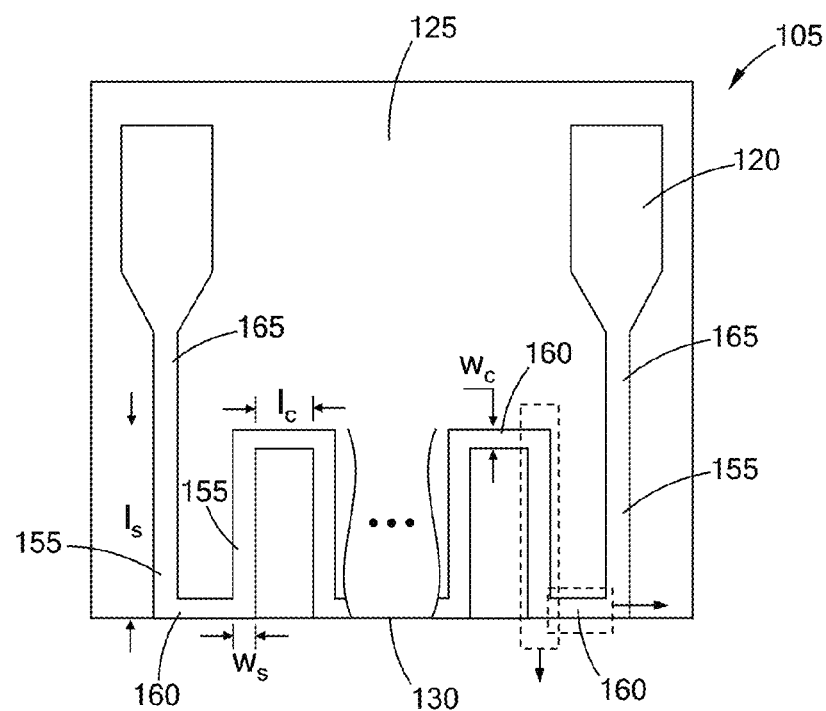

Referring now to FIGS. 2A and 2B, an exemplary rolled-up structure (e.g., a rolled-up inductor) 100 for a RFIC is shown. FIG. 2A shows a planar multilayer sheet 105 comprising a conductive pattern layer 120 on a strained layer 125 prior to rolling up, and FIG. 2B shows a schematic of a rolled-up inductor structure 100 that includes the conductive pattern layer 120 of FIG. 2A after full or partial relaxation of the residual stress in the strained layer 125. Accordingly, after rolling, the strained layer 125 may be referred to as the strain-relieved layer 125.

The rolled-up inductor 100 comprises a multilayer sheet 105 in a rolled configuration 110 comprising multiple turns about a longitudinal axis 115. The multilayer sheet 105 includes a conductive pattern layer 120 on a strain-relieved layer 125. The conductive pattern layer 120 comprises at least one conductive strip 155 having a length $l_s$ extending in a rolling or circumferential direction. The at least one conductive strip 155 thereby wraps around the longitudinal axis in the rolled configuration.

As shown in FIGS. 2A and 2B, a plurality of the conductive strips 155 may be disposed along the direction of the longitudinal axis 115 and connected in series by connecting lines 160. Each of the conductive strips 155 serves as an inductor cell of the rolled-up inductor structure; accordingly, the terms "conductive strip" and "inductor cell" are used interchangeably throughout the present disclosure. The conductive pattern layer 120 may also comprise two conductive feed lines 165 connected to the conductive strip 155 to provide a pathway for passage of electrical current therethrough. The conductive feed lines 165 may not be part of the rolled configuration 110; that is, the conductive feedlines do not necessarily wrap around the longitudinal axis 115. It is also possible that the conductive feed lines may not be present if a signal may be fed to the rolled-up inductor by other passive or active components on the chip.

As can be seen in reference to FIGS. 2A and 2B, a first turn of the rolled configuration 110 comprises a first edge 130 of the sheet 105 and may define a hollow cylindrical core 135 of the rolled configuration 110. The conductive pattern layer 120 may comprise a continuous metal pattern and/or discrete pattern elements, as discussed in more detail below. The conductive pattern layer 120 may be formed by depositing a metal thin film on a substrate (e.g., a planar strained layer) by a method such as sputtering or evaporation, and then patterning the metal thin film using lithography and etching steps known in the art to create a conductive pattern.

Figure 3A:
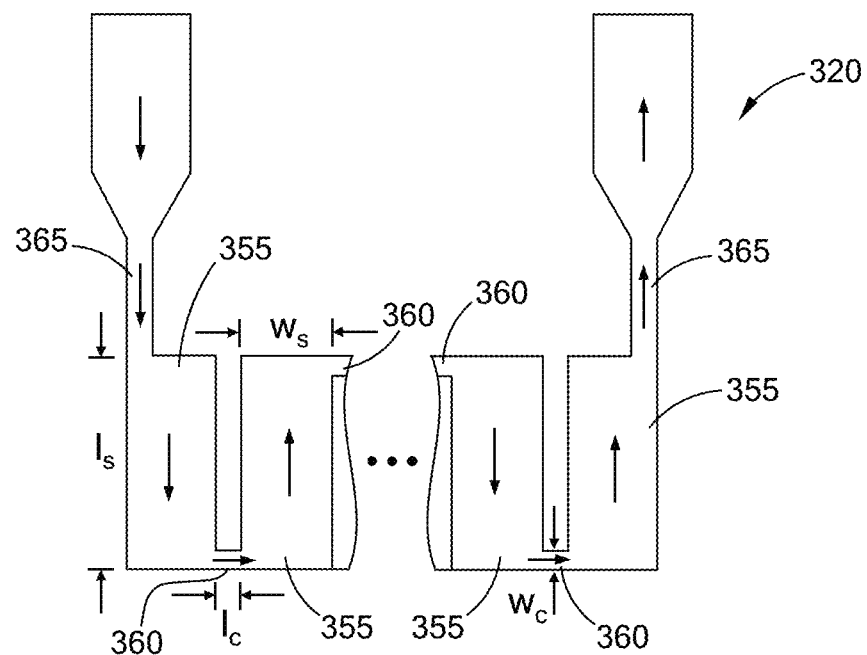
FIGS. 3A and 3C show top views of two exemplary metal patterns for a rolled up inductor according to an embodiment in which the current flows in opposite directions in adjacent inductor cells (as indicated by the arrows)
Figure 3B:
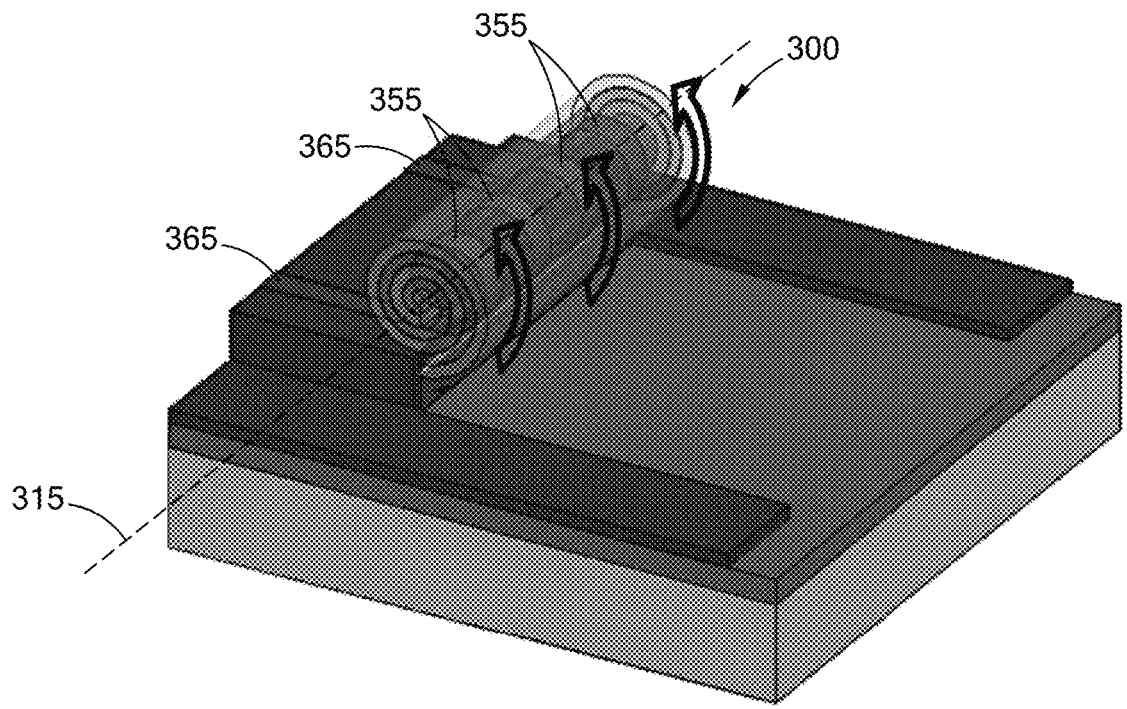
FIG. 3B shows the rolling process schematically including the membrane releasing mechanism and the rolling direction.

Referring to FIGS. 3A and 3B, which show an exemplary conductive pattern layer 320 and the formation of a rolled-up inductor 300, the conductive pattern layer 320 may comprise a series of conductive strips or inductor cells 355 repeating along a direction of the longitudinal axis, where each inductor cell has a length extending in a circumferential (or rolling) direction. In the rolled configuration, the inductor cells 355 wrap around the longitudinal axis 315, as shown schematically in FIG. 3B. Each inductor cell 355 has a width $w_s$ and a length $l_s$ along the rolling or circumferential direction. The inductance may be maximized when the inductor cells 355 are aligned such that the length of each cell 355 is substantially parallel to (e.g., within ±1° of) the rolling direction. If the inductor cells 355 are positioned at a non-zero angle with respect to the rolling direction, the inductance may be reduced.

Typically, the conductive pattern layer 320 may include at least one inductor cell, and typically includes at least two inductor cells. For example, there may be at least four inductor cells, or at least six inductor cells. Since it is advantageous to minimize the footprint of the rolled-up structure, there are typically no more than 50 inductor cells, or no more than 20 inductor cells, and there may be no more than 10 inductor cells. For example, the conductive pattern layer 320 may comprise n inductor cells 355, where n is an even number from 2 to 20, or from 2 to 10.

The length $l_s$ of the inductor cell(s) 355 may be at least about 20 microns, at least about 40 microns, at least about 60 microns, at least about 80 microns, or at least about 100 microns. Typically, the length $l_s$ is no greater than about 2 mm, no greater than 1 mm, no greater than about 500 microns, or no greater than about 200 microns. For example, $l_s$ may range from about 50 microns to about 150 microns, or from about 70 microns to about 100 microns. The width $w_s$ of the inductor cell(s) 355 is typically from about 5 microns to about 25 microns.

The conductive pattern layer 320 may further comprise n−1 connecting lines 360, where each connecting line 360 connects one inductor cell 355 to an adjacent inductor cell 355. The inductor cells 355 may thus be connected in series by the connecting lines 360.

Figure 3C:
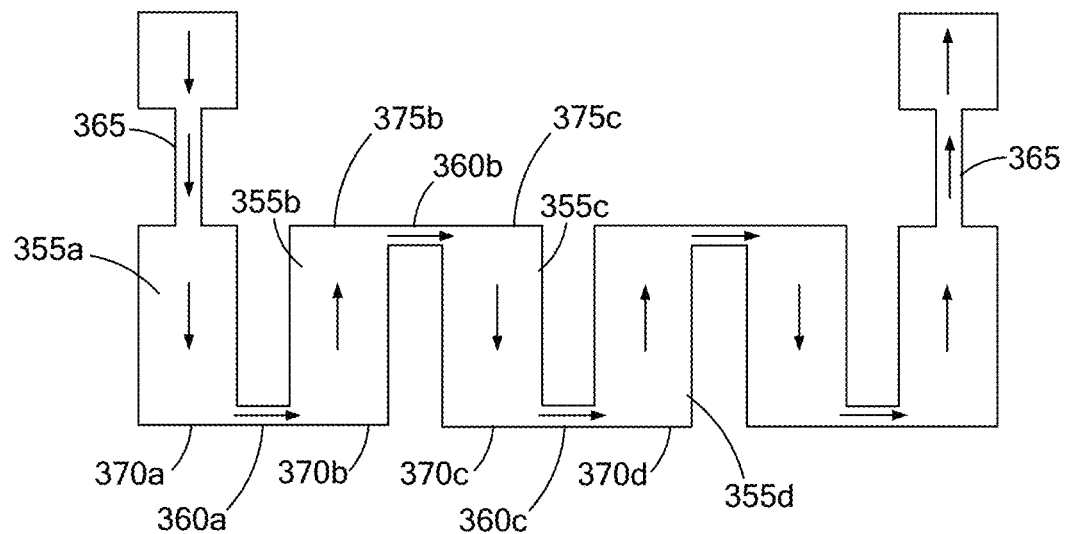

Referring to FIG. 3C, a first connecting line 360a may connect a base 370a of a first inductor cell 355a to a base 370b of a second inductor cell 355b and a second connecting line 360b may connect a top 375b of the second inductor cell 355b to a top 375c of a third inductor cell 355c. A third connecting line 360c may connect a base 370c of the third inductor cell 355c to a base 370d of a fourth inductor cell 355d. The configuration may be repeated until the $(n-1)^{th}$ connecting line connects the base of the $(n-1)^{th}$ inductor cell to the base of the $n^{th}$ inductor cell (or the top of the $(n-1)^{th}$ inductor cell to the top of the $n^{th}$ inductor cell), where in the example of FIG. 3C, n is 6. In the configuration of this embodiment, electrical current flows through the adjacent inductor cells in opposing directions, as shown by the arrows. The connecting lines may be disposed substantially parallel (e.g., within ±1° of) to the longitudinal axis.

Accordingly, each inductor cell of the rolled up structure may have a high (maximum) inductance, but because the current flows in opposing directions in the adjacent inductor cells, there may be a strong cancelling mutual inductance between them. It may be beneficial to reduce the cancelling mutual inductance as much as possible. To do so, the spacing between adjacent inductor cells may be increased. Referring again to FIG. 3A, each inductor cell 355 has a width $w_s$ and a length $l_s$ along the rolling or circumferential direction, and the connecting lines 360 have a width $w_c$ and length $l_c$, the latter of which defines the separation distance between inductor cells in this embodiment. Typically, the length $l_c$ is about 60 microns or less, about 40 microns or less, about 20 microns or less, or about 15 microns or less. Typically, the length $l_c$ is also about 5 microns or greater, or about 10 microns or greater.

The width of the connecting lines 360 affects their electrical resistance and inductance. If the width is chosen to be too large, it may introduce a large capacitance; however, if the width is too small, it may introduce a large resistance. Therefore, a typical value for the width $w_c$ of the connecting lines 360 is about 1-50 microns. For example, the width may be in the range from about 1 micron to about 30 microns, from about 2 microns to about 20 microns, or from about 5 microns to about 15 microns. Also, the length $l_c$ may be limited to minimize the resistance and inductance introduced by the connecting lines.

In addition to the connecting lines 360, there may be two conductive feed lines 365 connected to the series of inductor cells 355 at respective ends thereof. As shown in FIGS. 3A and 3B, the two conductive feed lines 365 may extend away from the series of cells in a circumferential direction. Alternatively, the two conductive feed lines may extend away from the series of cells in another direction(s), such as in the same or opposing directions substantially parallel to (e.g., within ±1° of) the longitudinal axis 315 of the rolled structure 300.

Figure 4A:
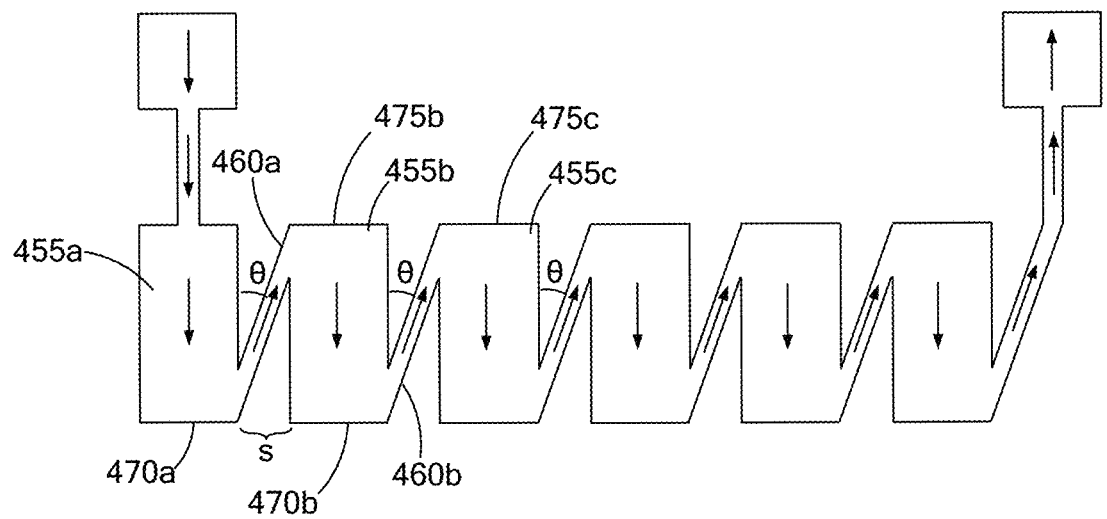
FIGS. 4A, 4B and 4C show top views of three exemplary metal patterns for a rolled-up inductor according to an embodiment in which the current flows in the same direction in adjacent inductor cells (as indicated by the arrows).
Figure 4B:
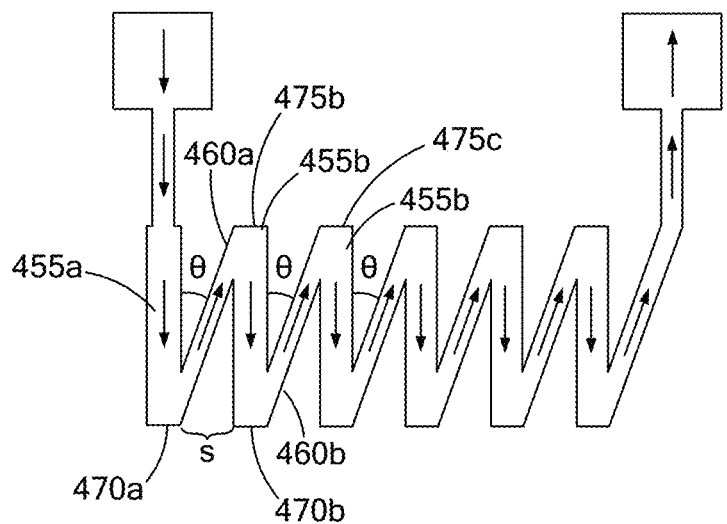

Referring to the exemplary metal patterns of FIGS. 4A and 4B, a first connecting line 460a may connect a base 470a of a first inductor cell 455a to a top 475b of a second inductor cell 455b, and a second connecting line 460b may connect a base 470b of the second inductor cell 455b to a top 475c of a third inductor cell 455c. The configuration may be repeated until the $(n-1)^{th}$ connecting line connects the base of the $(n-1)^{th}$ inductor cell to the top of the $n^{th}$ inductor cell, where in the examples of FIGS. 4A and 4B, n is 6. Each of the connecting lines 460a, 460b, etc. may define an angle θ with respect to a side of the adjacent inductor cell 455a, 455b, etc. and thus may be referred to as angled connecting lines. In this configuration, electrical current flows through the adjacent inductor cells in the same direction, as shown by the arrows.

Since adjacent inductor cells have current flowing in the same direction, there is no inductance cancelling effect between them, in contrast to the previous embodiment. In fact, there may be an inductance enhancement effect. However, the presence of the angled connecting lines, which have a current flow opposite to the current flow in the inductor cells, may introduce an inductance cancelling effect. This effect may be minimized by increasing the angle θ, which in turn increases the spacing S between the inductor cells. On the other hand, a larger spacing between the inductor cells may lead to a larger footprint for the series of inductor cells, and thus the rolled-up inductor may occupy an undesirably larger wafer area. With a smaller angle θ, the inductor cells may be positioned closer to each other, and therefore a larger mutual enhancement inductance may be obtained; at the same time, however, the inductance cancelling effect of the angled connection lines in the rolled configuration may increase.

Figure 4C:
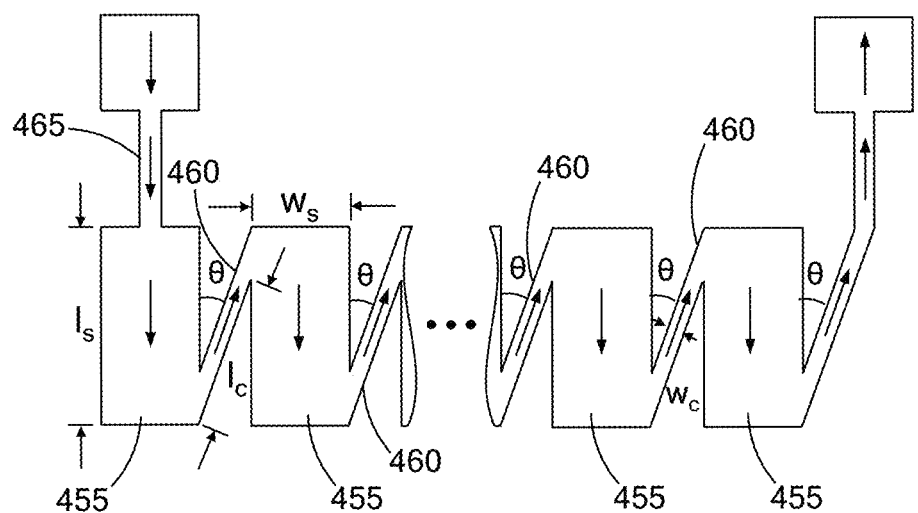

Typically, the optimal angle θ has a value that defines a spacing (S) between the adjacent inductor cells 455 of about 40 microns or less, about 20 microns or less, or about 15 microns or less. The angle θ may be selected such that the spacing between adjacent inductor cells 455 is at least about 5 microns, or at least about 10 microns. The length $l_s$ of the inductor cells 455 influences the value of the angle θ needed to achieve the above mentioned spacings. Geometrically, for the embodiment of FIGS. 4A-4C, the angle θ may be defined as follows: $\cos\theta = l_s/l_c$ and the spacing (S) between the adjacent inductor cells may be defined as $\sin\theta = S/l_c$. Typically, the angle θ has a value in the range of from about 30° to about 60°.

The width $w_c$ of the connecting lines 460 is usually chosen to be about 25-33% of the width $w_s$ of the inductor cell. Since the width $w_s$ is typically from about 15 microns to about 20 microns, the width $w_c$ may be from about 3 microns to about 7 microns, or about 5 microns, in one example.

The strain-relieved layer 125 that underlies the conductive pattern layer 120 may comprise one or more sublayers that are at least partially relieved of lattice strain as a consequence of rolling. The multilayer sheet comprising the strain-relieved layer includes less lattice strain (or no lattice strain) in the rolled configuration than in an unrolled or planar configuration. Accordingly, the one or more sublayers that are referred to as a strain-relieved layer in the rolled configuration may be referred to as a strained layer in the unrolled configuration.

In the example of FIGS. 1A-1D, the strain-relieved layer (and the strained layer) may comprise two sublayers, which may be referred to as a bilayer. Specifically, the strained layer or bilayer 140 may comprise a top sublayer 140a in tension and a bottom sublayer 140b in compression to facilitate the rolling up shown schematically in FIGS. 1C-1D. The bilayer 140 may thus be referred to as an oppositely strained bilayer. The strain-relieved layer and the strained layer may comprise a single crystalline, polycrystalline or amorphous material.

The strain-relieved and strained layer may comprise an electrically insulating material such as silicon nitride, silicon oxide, or boron nitride. For example, the layer may comprise non-stoichiometric silicon nitride ($SiN_x$, where x may have a value from about 0.5 to about 1.5), which may be amorphous, or stoichiometric silicon nitride (e.g., $Si_3N_4$, $Si_2N$, SiN or $Si_2N_3$). The layer may also or alternatively include another material, such as an elemental or compound semiconducting material or a polymer. For example, single crystal films such as InAs/GaAs, InGaAs/GaAs, InGaAsP/InGaAsP, Si—Ge/Si may be used as the strained layer.

Typically, the strained layer has a thickness of from about 2 nm to about 200 nm; however, in some embodiments (e.g., in which single crystals are used), the thicknesses may be about 1 nm or less, down to a few monolayers or to one monolayer. Generally, the thickness is at least about 5 nm, at least about 10 nm, at least about 20 nm, at least about 30 nm, at least about 40 nm, or at least about 50 nm. The thickness may also be no more than about 200 nm, no more than about 150 nm, no more than about 100 nm, no more than about 80 nm, no more than about 60 nm, or no more than about 40 nm. When a large number of turns is required and the strained layer includes two oppositely strained sublayers (a bilayer), it may be advantageous for the sublayers to have the same thickness.

The strain in the strained layer may be introduced by compositional or structural differences between sublayers that are successively deposited (e.g., by chemical vapor deposition) so as to be in contact with each other. For example, adjacent contacting sublayers (e.g., top and bottom sublayers) may be formed with different lattice parameters and/or with different stoichiometries. To facilitate rolling up upon release from an underlying sacrificial layer 145 deposited on a substrate 150, the top sublayer 140a may may have a smaller lattice parameter than the bottom sublayer 140b, as shown schematically in FIG. 1A. In such a circumstance, the top sublayer 140a comprises a residual tensile stress, and the bottom sublayer 140b comprises a residual compressive stress. The residual stress profile in the sublayers 140a, 140b may be reversed (compressive on top; tensile on bottom) in order to having the rolling proceed downward, instead of upward, which is possible for any of the embodiments described herein. It is also possible that a single layer may be formed with appropriate compositional and/or structural gradients across the layer to produce the desired stress profile in the strained layer. $SiN_x$ films deposited by PECVD differ from single crystal films in that internal strain may not be developed by crystal lattice mismatch but rather by density differences and thermal mismatch achieved by appropriate deposition conditions.

It has been demonstrated experimentally that thin films deposited by different methods or under different conditions may provide a strained layer having adjustable values of residual stress in a wide range, such as from 478 to −1100 MPa for silicon nitride ($SiN_x$) and from greater than 1000 MPa to less than −1000 MPa for metal thin films on $SiO_2$, where positive values of residual stress correspond to tensile stresses, and negative values correspond to compressive stresses. By carefully designing the residual stress mismatch in each sublayer, it is possible to generate a large enough driving force to overcome resistance and to continue rolling over a long enough distance to form as many turns as needed. To create a higher residual stress mismatch during deposition of the strained $SiN_x$ layers, for example, and thus a smaller tube diameter, the PECVD environment may be changed by adjusting a ratio of the $SiH_4$ flow rate to the $NH_3$ flow rate or by optimizing the power of the RF source. As long as the thin sheet or membrane is strained and can be released from the underlying substrate, rolled-up 3D architectures may form spontaneously with simple planar processing. The concept has been demonstrated for compound and elemental semiconductor material systems as well metal and dielectric materials, including silicon nitride.

The conductive pattern layer may comprise one or more high conductivity materials selected from the group consisting of carbon, silver, gold, aluminum, copper, molybdenum, tungsten, zinc, palladium, platinum and nickel. The conductive pattern layer may be formed by depositing one or more high conductivity thin films on a substrate (e.g., a planar strained layer) by a method such as sputtering or evaporation, and then patterning the thin films using lithography and etching steps known in the art to create a conductive pattern. As noted above, the conductive pattern layer may include additional tensile strain to facilitate rolling when the sacrificial layer is removed. Advantageously, the conductive pattern layer may be made as thick and smooth as possible to reduce the thin film or sheet resistivity without interfering with the rolling process. The sheet resistivity of the conductive pattern layer(s) may have a significant impact on the performance and size of the rolled-up structure and is kept as low as possible. For example, the sheet resistivity may be about 5 μohm·cm or less.

The conductive pattern layer may have a multilayer structure, such as a Ni—Au—Ni trilayer structure. In such cases, the bottom layer may act as an adhesion layer, the middle layer may act as a conductive layer, and the top layer may act as a passivation/protection layer. Typically, adhesion and passivation layers have a thickness of from about 5-10 nm. As described above, the conductive pattern layer may include a first conductive film separated from a second conductive film on the strain-relieved layer in a thickness direction or in a rolling direction. In addition, each of the first and second conductive films may have a different thickness and/or include one or more different high conductivity materials.

It is also contemplated that the conductive pattern layer may comprise a two-dimensional material, such as graphene or transition metal dichalcogenides, e.g., $MoS_2$ $MoSe_2$, $WSe_2$ and/or $WS_2$. Such two-dimensional materials can be viewed as free-standing atomic planes comprising just a single monolayer or a few monolayers of atoms. For example, the conductive pattern layer may comprise a few monolayers of graphene formed on a strained $SiN_x$ bilayer, or a single monolayer of graphene may be formed on hexagonal boron nitride, which may replace the strained $SiN_x$ bilayer. It is also contemplated that the conductive pattern layer may comprise carbon nanotubes (in the form of bundles or an array) that may be grown on, for example, a quartz substrate and then transferred to a strained $SiN_x$ bilayer for roll-up.

Typically, the conductive pattern layer may have a thickness of at least about 5 nm, at least about 10 nm, at least about 20 nm, at least about 50 nm, at least about 70 nm, or at least about 90 nm. The thickness may also be about 200 nm or less, about 150 nm or less, or about 100 nm or less. For example, the thickness may range from about 10 nm to about 100 nm, or from about 20 nm to about 80 nm. However, in some embodiments, such as those in which the conductive pattern layer comprises a two-dimensional material as discussed above, the thickness may be about 1 nm or less, down to a few monolayers or to one monolayer.

The sacrificial layer may comprise a material that can be etched without removing or otherwise damaging the strained layer. For example, single crystalline and/or polycrystalline Ge, $GeO_x$, Si, and AlAs, as well as photoresist, may be used as a sacrificial layer. In one example, a strained bilayer comprising InAs/GaAs may be formed on a sacrificial layer comprising AlAs that may be etched away with hydrofluoric acid (HF).

The rolled configuration of the multilayer sheet may have a length along the longitudinal axis that depends on the number of inductor cells and on the geometry of the conductive pattern layer. Typically, the length is at least about 10 microns, at least about 20 microns, at least about 50 microns, at least about 100 microns, or at least about 200 microns, and the length may also be about 1000 microns or less, or about 800 microns or less. For example, the length may range from about 10 microns to about 1000 microns, or from about 100 microns to about 800 microns, or from about 300 microns to about 600 microns.

In addition, the rolled configuration of the multilayer sheet may have a diameter (inner diameter) of from about 1 micron to about 30 microns, or from about 3 microns to about 8 microns. Typically, the inner diameter of the rolled configuration is no more than about 30 microns, no more than about 20 microns, or no more than about 10 microns. The inner diameter may also be at least about 1 micron, at least about 4 microns, or at least about 8 microns. The inner diameter of the rolled configuration depends on the thickness of the multilayer sheet as well as the amount of strain in the unrolled strained layer prior to release of the sacrificial layer. A thicker multilayer sheet may tend to roll to a larger inner diameter; however, a higher level of strain in the strained layer can offset this effect, since the inner diameter (D) of the rolled configuration is proportional to the thickness (t) of the multilayer sheet and is inversely proportional to the amount of strain ($\in$) therein (D∝t/$\in$).

To maximize the inductance and quality factor of the rolled-up inductor structures, as discussed further below, it may be advantageous to maximize the ratio of the thickness of the conductive pattern layer (e.g., the thickness of the conductive strips) to the inner diameter of the rolled configuration. For example, the ratio may be about 0.005 or greater, about 0.007 or greater, about 0.01 or greater, or about 0.015 or greater. The ratio is typically about 0.03 or less, or about 0.02 or less. In one example, a ratio of 0.01 can be calculated for a conductive pattern layer thickness of 100 nm (0.1 micron) and a rolled configuration diameter of 10 microns. It may also be advantageous in terms of the properties of the rolled-up inductor to form the rolled configuration with a large number of turns.

Depending on (a) the length of the multilayer sheet in the rolling or circumferential direction, (b) the thickness t of the multilayer sheet, and (c) the amount of strain $\in$ in the multilayer sheet prior to rolling, the rolled configuration may include at least about 5 turns, at least about 10 turns, at least about 20 turns, at least about 40 turns, at least about 60 turns, or at least about 80 turns. Typically, the rolled configuration includes no more than about 120 turns, or no more than about 100 turns. For example, the number of turns may range from about 20 turns to about 80 turns, or from about 40 turns to about 60 turns. The number of turns can be influenced by the size (e.g., length and thickness) and shape of the multilayer sheet before rolling up.

Referring again to FIGS. 2A and 2B, an exemplary on-chip rolled up inductor structure involving 3D multiple-turn metal spirals is shown. A square wave-like patterned metal thin film layer is formed (e.g., by deposition and patterning) on a strained membrane, which may be formed of stoichiometric or nonstoichiometric silicon nitride. By etching away the sacrificial layer, as shown schematically in FIG. 1C, the inductor cells roll up with the strained membrane to form 3D multiple-turn spirals. As noted above, each metal strip along the rolling direction, defined by its width $w_s$ and length $l_s$, may be referred to as an inductor cell. The cells are connected in series by connection lines, each defined with a width $w_c$ and length $l_c$, which defines the separation distance between cells in this embodiment.

An inherent advantage of the rolled-up inductor structure is a small on-wafer footprint compared to alternative two-dimensional inductor geometries. On-wafer footprints (areas) of less than 3000 $\mu m^2$ and even less than 1000 $\mu m^2$ have been demonstrated. In general, the approach described herein is useful for making rolled-up inductor structures having a footprint of about 10,000 $\mu m^2$ or less, about 5000 $\mu m^2$ or less, or about 3000 $\mu m^2$ or less, about 1000 $\mu m^2$ or less, about 500 $\mu m^2$ or less, or about 300 $\mu m^2$ or less. The footprint is typically at least about 100 $\mu m^2$, or at least about 200 $\mu m^2$.

Figure 5A:
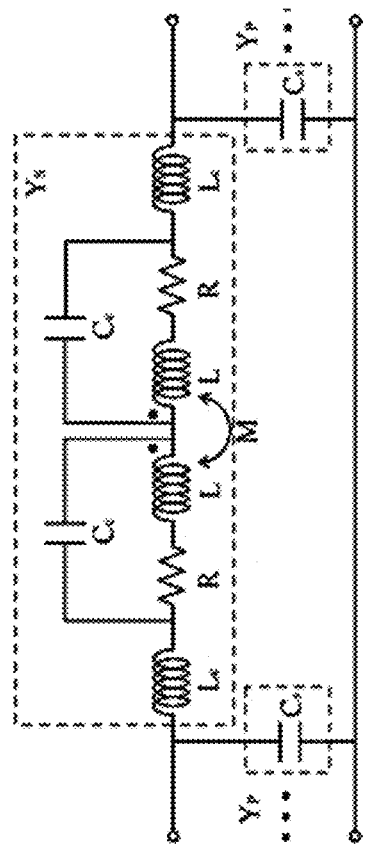
FIG. 5A shows a lumped circuit physical model of an exemplary rolled-up tube inductor including a schematic showing the geometric definition using a concentric cylinder assumption.
Figure 5B:
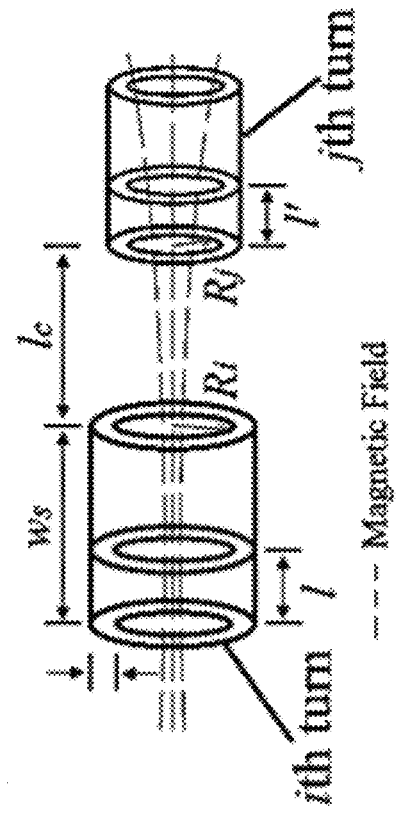
FIG. 5B shows a lumped circuit model for two adjacent cylindrical cells connected in series.

When AC current flows in and out the feedlines of the rolled-up inductor, a time varying electromagnetic field is triggered. Because the membrane or sheet thickness $t_{SiN}$ (typically about 40 nm) is very small compared to the tube radius $R_1$ (e.g., from about 0.5 $\mu m$ to about 5 $\mu m$), the radius change of each turn of the spiral structure is negligible. Therefore, the spiral structure can be treated electrically as multilayer closed concentric cylinders, as illustrated in FIG. 5A. $R_1$ is the inner radius, $N_t$ is the number of turns, $t_{SiNx}$ is the thickness of the membrane, which in this example is $SiN_x$, and $t_n$ is the thickness of the metal thin film.

As discussed above, the current flow directions in any adjacent cells of some embodiments of the rolled inductor are opposite, and thus a cancellation mutual inductance M is introduced to each cell. Here we assume M is negligible when the coupling coefficient (M/L) of adjacent cells is less than 1%. However, the separation distance $l_c$ needed to meet this requirement depends on the cell structure. For example, adjacent cells with more turns share stronger magnetic flux density therefore require a larger $l_c$ to reduce the mutual inductance M; and vice versa. The shared magnetic flux density is inversely proportional to the cubic order of $l_c$, which means the coupling can be quickly reduced by separating the adjacent cells further if there are more turns. Inevitable parasitic capacitances are produced by the coupling of conduction layers in the spiral, $C_c$, and by the substrate capacitance, $C_s$, respectively. When the conduction layers are made of metal, such as silver, copper, gold, or aluminum, the depth of penetration by skin effect at high frequency is much greater than the metal thickness. This means that the RF mutual resistance between the metal thin film layers introduced by the eddy current effect is negligible and the ohmic loss is only caused by DC resistance R. Also, the substrate loss induced by the substrate eddy current is not significant because of the small on-wafer footprint and the fact that the electromagnetic field is mostly confined in the cells not in the substrate (unlike the planar inductor).

Figure 5C:
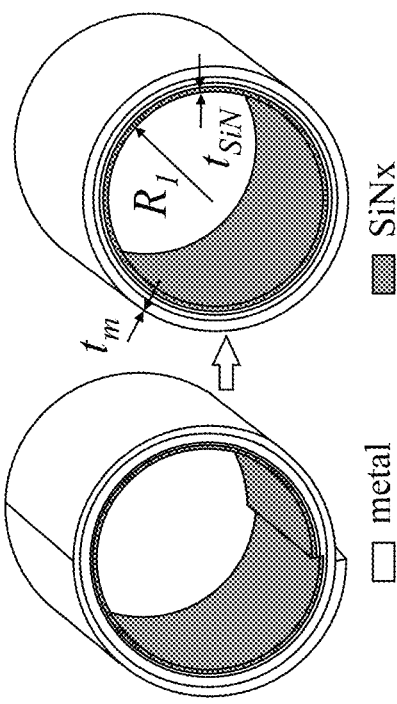
FIG. 5C shows a lumped circuit model for several (N) cylindrical cells connected in series.
Figure 5D:
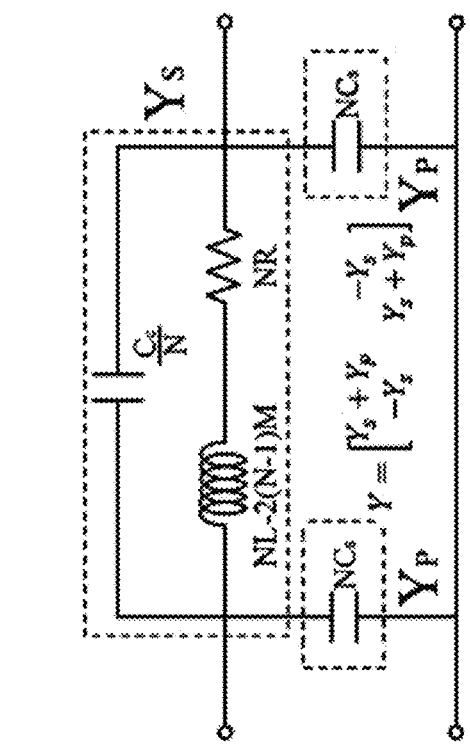
FIG. 5D shows schematically the magnetic coupling between cylinders in adjacent cells.

The lumped circuit model for two adjacent cells can then be built as shown in FIG. 5C and for a number of (N) identical spiral cells connected in series as shown in FIG. 5D. (The magnetic coupling between any non-adjacent cells is ignored due to long separation distance.) The parasitic connection line inductance $L_c$ is negligible because of the selection $l_s \gg l_c$. This lumped circuit model can be seen as a two-port π-type admittance network. The effective inductance $L_{e\_total}$, Q factor $Q_{total}$ and self-resonance frequency $f_0$ can be then derived from the admittance matrix Y as follows:

$$L_{e\_total} = \frac{\text{Im}\left(-\frac{1}{Y_{12}}\right)}{\omega} \quad (1)$$

$$= \frac{\text{Im}\left(\frac{1}{Y_s}\right)}{\omega}$$

$$= \frac{N_c\{L' - C_c[R^2 + \omega^2(L')^2]\}}{1 + \omega^2 C_c^2[R^2 + \omega^2(L')^2] - 2\omega^2 C_c L'}$$

$$Q_{total} = \left|\frac{\text{Im}(Y_{11})}{\text{Re}(Y_{11})}\right| \quad (2)$$

$$= \left|\frac{\text{Im}(Y_p + Y_s)}{\text{Re}(Y_p + Y_s)}\right|$$

$$= \frac{\omega|L' - (C_c + N_c^2 C_s)[R^2 + \omega^2(L')^2]|}{R}$$

$$f_0 = \frac{1}{2\pi}\sqrt{\frac{1}{(C_c + N_c^2 C_s)L'} - \frac{R^2}{(L')^2}} \quad (3)$$

where $L'=L-2(1-N_c^{-1})M$, $N_c$ is the number of cells, L is the self inductance of each cell.

To simplify the calculation of M and L and obtain accurate expressions of them that can be embedded in a circuit level simulator, the magnetic flux density B(l) in each slice of a single layer cylinder (slice in FIG. 5D) is assumed to be uniform radially, but its value is dependent on the cylinder position and its inner radius. Then the mutual inductance $M_{ij}$ between any two cylinders in adjacent cells (the ith cylinder in one cell and the jth cylinder in another cell as illustrated in FIG. 5D) can be calculated by $$M_{ij} = \frac{\pi\mu_0 R_i^2}{4l_m w_s^2} D_{ej},$$

where $R_i = R_1 + (i-1)t_{SiN}$, $i=1, 2, 3 \ldots$, $\mu_0$ is the permeability of air, and $D_{ej}$ denotes the geometric characteristic dimension (GCD) of the jth single layer cylinder. If $l_c$ is set to be less than zero ($l_c<0$) mathematically, it means that the two different turns FIG. 5D physically overlap so that the beginning of the smaller turn is on the "negative" side of the end of the larger turn. When $l_c=-w_s$, the ith and jth single layer cylinders are equivalent to two different turns in one cell, and the self-inductance $L_{self}$ of the ith single layer cylinder and mutual inductance $L_{mutual}$ between the ith and jth single layer cylinders in one cell can be expressed as $L_{self\_ii}=M_{ij}|_{i=j,l_c=-w_s}$, $L_{mutual\_ij}=M_{ij}|_{i\neq j,l_c=-w_s}$, respectively. The total inductance L of multilayer concentric cylinders can then be expressed by the sum of all $L_{self\_ii}$ and $L_{mutual\_ij}$, $i=1, 2, 3 \ldots N_t$, $j=1, 2, 3 \ldots N_t$, and the mutual inductance M can then be expressed by the sum of all $M_{ij}$, $i=1, 2, 3 \ldots N_t$, $j=1, 2, 3 \ldots N_t$ with $l_c>0$.

Because the distance between the metal layers of each turn is very small ($\Delta R \sim 40$ nm), the adjacent metal layers may not be not equipotential under high frequency operation and therefore the crosstalk capacitance may not be neglected. The sum of all overlap capacitances is used in the eauivalent structure to represent the crosstalk distribution capacitance $$C_c = \frac{2\pi\varepsilon_{SiN} w_s}{\ln\left[\frac{1 + t_{SiN}(N_t - 1)}{R_1}\right]},$$

which can be approximated, similar to that of a coaxial capacitor. Substrate parasitic capacitance $C_s$ of one cell is approximately proportional to the projection area on the substrate by the metal spirals and connection lines. $C_s$ can be estimated by $$\frac{1}{2}\{2w_s[R_1 + N_t t_m + (N_t - 1)t_{SiN}] + w_c l_c\}C_{sub}.$$

The factor two in the denominator accounts for the fact that the substrate parasitic capacitance is assumed to be distributed equally at the two ends of the inductor. $C_{sub}$ is the capacitance per unit area of the silicon substrate, which is a function of the substrate doping. In this calculation and simulation, the resistivity of the silicon substrate is assumed to be 10 Ω-cm and the corresponding $C_{sub}$ is $1.6\times10^{-3}$ fF/μm². As discussed before, the resistance of a cell is calculated by DC resistance formula $R \approx \rho l_s/w_s t$ without an eddy current effect, where ρ is the resistivity of the metal thin film. However, the resistivity value of a given metal thin film depends on several fabrication and environment factors, including the thickness, the mean square root surface roughness, and the operating temperature when current passes through it. The resistivity values of bulk metal material, including silver (1.59 μΩ·cm), copper (1.72 μΩ·cm), gold (2.44 μΩ·cm) and aluminum (2.82 μΩ·cm), are first used to give the best theoretical performance of the tube inductor. The effect of metal thin film properties and structural characteristics on the inductor electrical performance, especially the Q factor, is then analyzed.

Figure 6A:
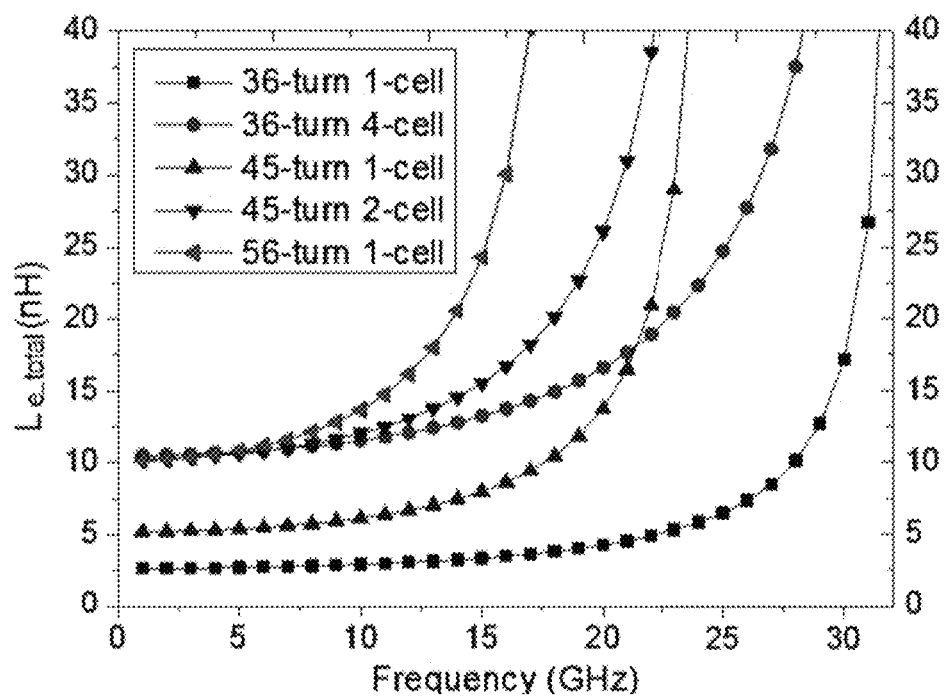
FIGS. 6A-6B show the performance of an exemplary rolled up inductor (e.g., as shown in FIGS. 3A-3C) as a function of number of turns and number of connected cells, where
Figure 6B:
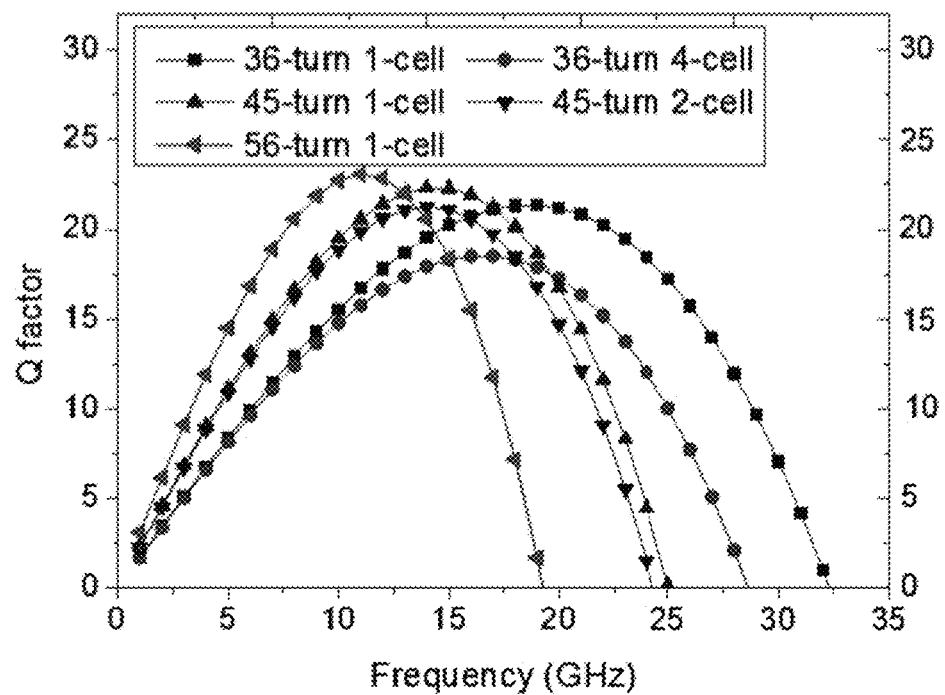

The lumped circuit physical model developed above makes it possible to evaluate a comprehensive set of tube structural parameters on the inductor performance quickly. The accuracy of the model was confirmed using the commercial software High Frequency Structure Simulator (HFSS) (ANSYS, Inc., Cecil Township, Pa.). Shown in FIGS. 6A-6B are the effects of number of turns (rotations in the self-rolled-up tube) and number of lateral unit cells on the total effective inductance $L_{e\_total}$ and Q factor as a function of operating frequency. It can be seen that large inductance values $L_{e\_total}$ can be obtained by increasing the number of turns in each cell or by connecting more cells in series. The designs with fewer cells have better Q factor and smaller footprint, but lower self-resonance frequency due to larger parasitic capacitance $C_c$ from serially connected cells in the spiral.

In contrast to planar spiral inductors, the Q factor and self-resonance frequency may remain high when connecting more cells in the self-rolled-up 3D spiral structures because of their weak dependence on the number of cells $N_c$ due to extremely small substrate capacitance $C_s$ (implied from equation (2) and (3)). An extreme reduction in the footprint of the device can be realized while maintaining or enhancing the performance.

For example, a design comprising a 45-turn 2-cell rolled inductor with an inner diameter of 3 μm, an inductor cell separation distance (spacing) of 15 μm, a membrane or sheet (e.g., SiN$_x$) of 40 nm in thickness, and a silver strip (inductor cell) of 15 μm in width and 100 nm in thickness may exhibit a total effective inductance of 10 nH, maximum Q factor of 21 at 15 GHz, self-resonance frequency at 25 GHz, and 45×16 μm² occupied wafer area. This footprint is 0.45% of that of a conventional planar spiral inductor, which has typical values of: 400×400 µm², 8 nH inductance, maximum Q factor of 6 at 3 GHz.

For a single cell design, a 56-turn inductor with otherwise the same structural parameters as the 2-cell design above may reach 10 nH. Remarkably, this design has a maximum Q factor of over 23 at 11 GHz, and occupies only 15×19 µm² wafer area, which is about 0.1% of that of conventional planar spiral inductors.

For a rolled inductor with a certain number of cells and turns, the dimension and fabrication quality of the membrane and the metal thin film can affect the inductor's performance. It has been reported that a deposition thickness as large as 300 nm is needed to reach an acceptable sheet resistivity (~2 µΩ·cm) for a Ag thin film on $SiN_x$, which can lead to a large rolled-up tube diameter and may inhibit or even stop the self-rolling process. On the other hand, a low resistivity Ag—W thin film has been reported to exhibit a sheet resistivity ~4 µΩ·cm with ~100 nm thickness, which is an acceptable thickness for rolling experimentally.

Figure 7A:
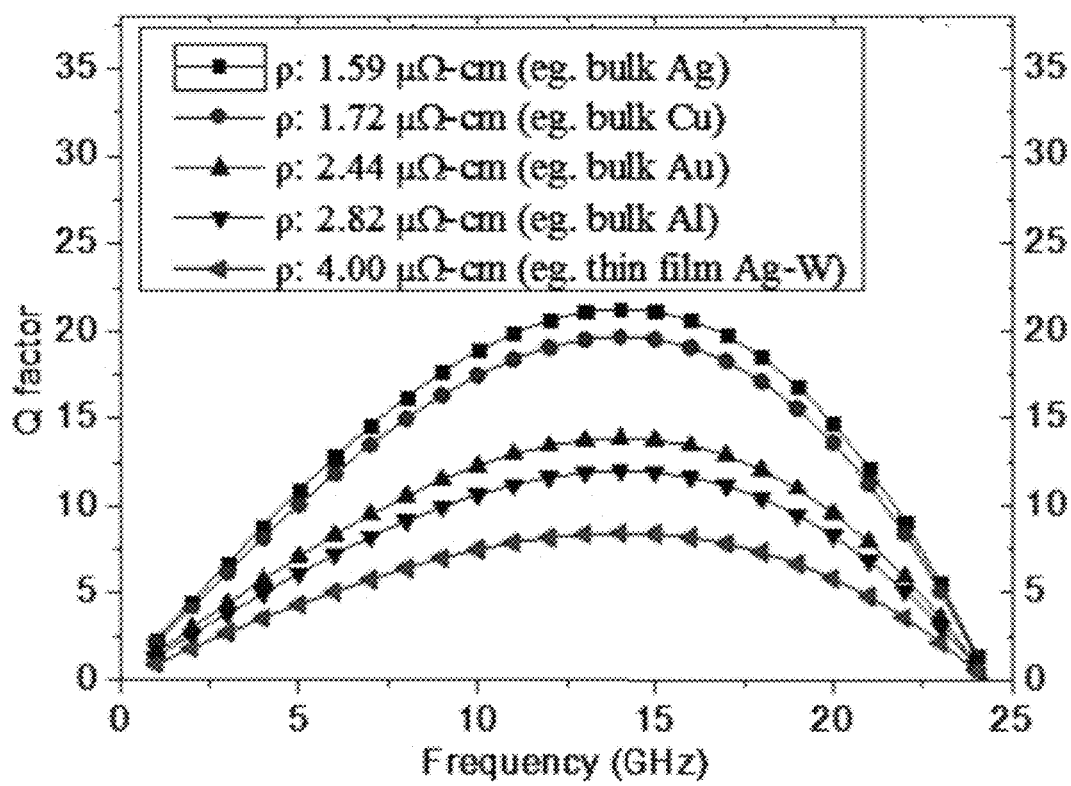
FIGS. 7A-7D show plots of Q factor $Q_{total}$ (FIGS. 7A and 7D) and total effective inductance $L_{e\_total}$ (FIGS. 7B and 7C) as a function of metal sheet resistivity ρ (FIGS. 7A and 7B) and metal strip width $w_s$ (FIGS. 7C and 7D) for a 45-turn 2-cell inductor operating in a frequency range of 1-25 GHz. For these examples, the tube inner diameter is set to be 3 μm, the separation distance between the two inductor cells is 15 μm, and the metal strip thickness is 100 nm. The inductor cell (metal strip) widths for the examples of FIGS. 7A and 7B are 15 μm and the sheet resistivity for the examples of FIGS. 7C and 7D is 4.0 μΩ·cm (for a silver-tungsten (Ag—W) thin film).
Figure 7B:
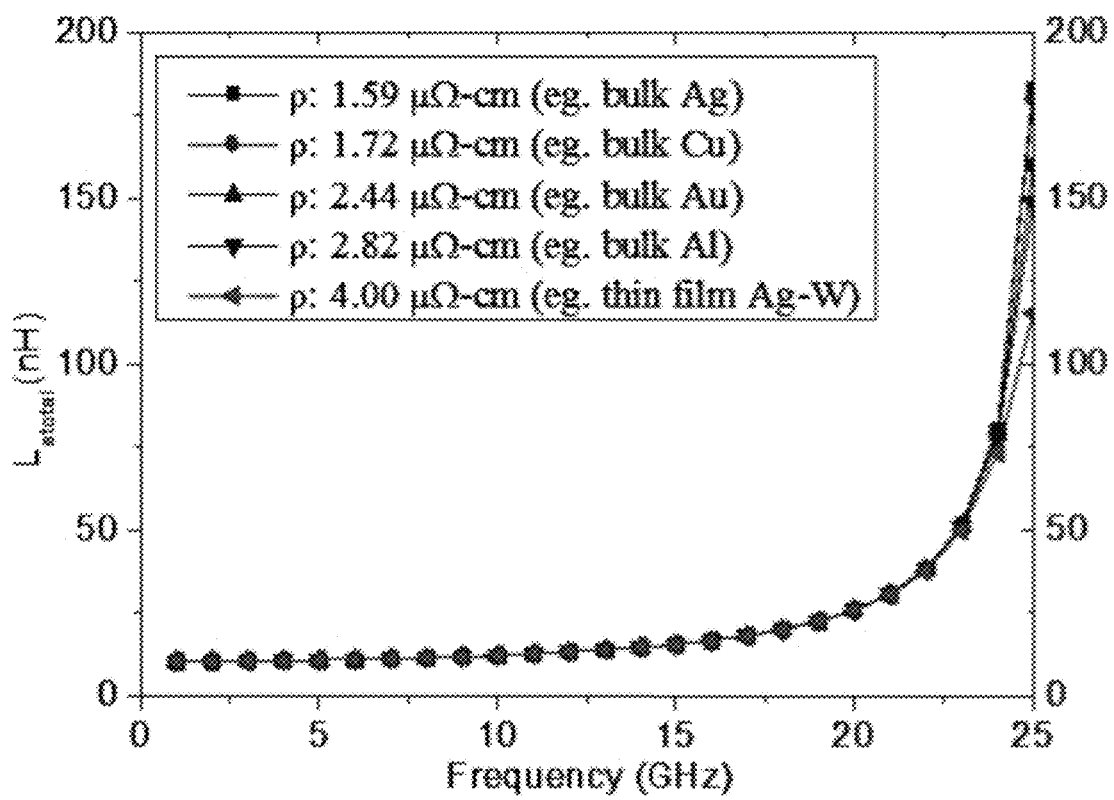
Figure 7C:
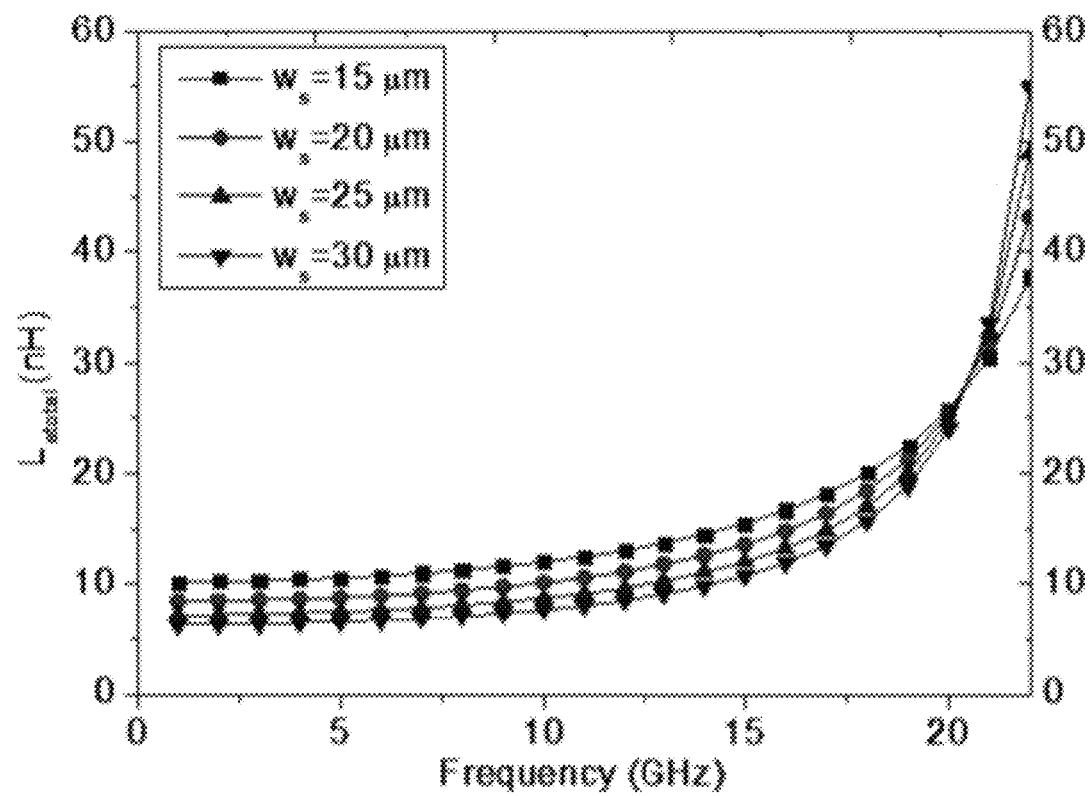
Figure 7D:
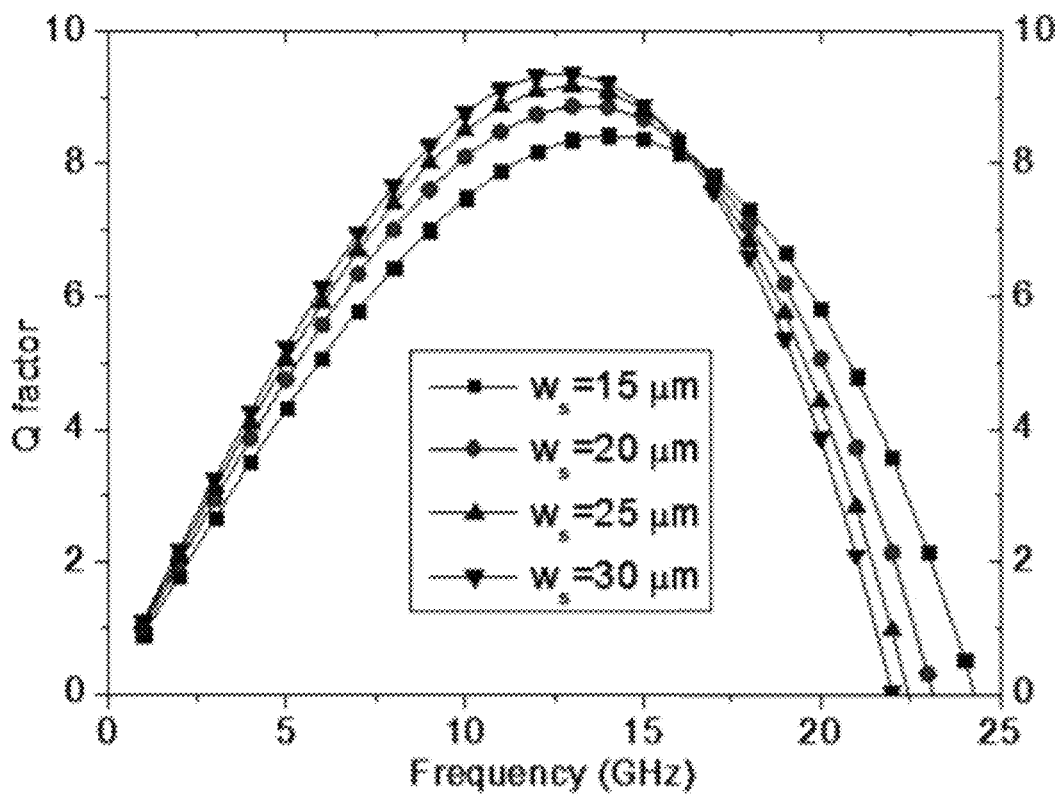

FIGS. 7A and 7B show the calculated Q factor and total effective inductance $L_{e\_total}$, respectively, for various sheet resistivity values. Clearly, high resistivity directly leads to reduction of the Q factor, while it does not change the inductance much until the frequency reaches about 25 GHz. Since the Q factor is determined by the total DC sheet resistance R of the metal thin film strips (inductor cells), when the metal thickness and sheet resistivity are fixed, the value of R can be reduced by increasing the width $w_s$ of the cells. However, as shown in FIG. 7C, the wider the width $w_s$ is, the smaller the total effective inductance $L_{e\_total}$ becomes. The reduction of $L_{e\_total}$ indicates weaker magnetic energy storage ability, which consequently results in only a small increase of Q factor as shown in FIG. 7D. In addition, although inductance is mainly affected by the inductor size and structure, large resistivity of the metal thin film can also have noticeable negative impact on it due to significant ohmic loss. For example, when the resistivity of the metal thin film is 30 µΩ·cm instead of 4 µΩ·cm for the same device in FIG. 7A, the maximum Q factor will be lower than 1 and the inductance will drop by 10%. All of the above analysis underlines the importance of optimizing the thin film metal resistivity to realize the full potential of the rolled-up tube inductor platform.

Fabrication Method

A method of making a rolled-up inductor structure for a radiofrequency integrated circuit includes forming a sacrificial layer on a substrate and forming a strained layer on the sacrificial layer, where the strained layer comprises an upper portion under tensile stress and a lower portion under compressive stress. The strained layer is held on the substrate by the sacrificial layer. A conductive pattern layer as described above is formed on the strained layer, and removal of the sacrificial layer from the substrate is initiated, thereby releasing an end of the strained layer. The removal of the sacrificial layer is continued, thereby allowing the strained layer to move away from the substrate and roll up to relieve strain in the strained layer. The conductive pattern layer adheres to the strained layer during the roll-up, and a rolled-up inductor structure is formed.

Forming the strained layer may entail depositing two sublayers that have different lattice parameters. Forming the strained layer may also or alternatively entail depositing two sublayers having different stoichiometries. A deposition method known in the art, such as physical vapor deposition or chemical vapor deposition, may be employed to form the strained layer and/or the sacrificial layer. The sacrificial layer may be removed by wet or dry etching with an appropriate etchant. The sacrificial layer may comprise a metal such as Ge that may be preferentially etched without etching the overlying strained layer or the underlying substrate material.

The conductive pattern layer may be formed by depositing a metal thin film on the strained layer by a vapor deposition method such as sputtering or evaporation, and then patterning the metal thin film using lithography and etching steps known in the art to create a metal pattern, thereby forming the conductive pattern layer. The conductive pattern layer may include at least one conductive line connected to the sacrificial layer and/or at least one conductive line connected to the substrate.

An exemplary fabrication method is described below in reference to FIGS. 8A-8G. Deposition of an isolation layer 850 on a silicon wafer 855 is shown schematically in FIG. 8A. The isolation layer 850 may be a thick film having a thickness of from about 0.5-2 microns and may comprise an oxide (e.g., $SiO_2$). Prior to deposition of the isolation layer 850, the surface of the silicon wafer 855 may be cleaned to remove oils, organic residues and/or oxides. The isolation layer 850 is typically formed on the silicon wafer 855 using plasma enhanced chemical vapor deposition (PECVD).

Figure 8A:
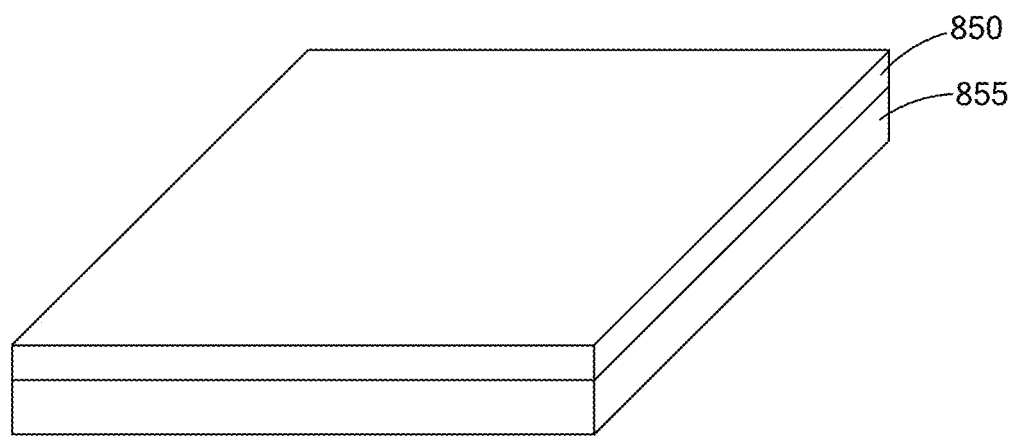
FIGS. 8A-8F show exemplary processing steps to form a rolled-up inductor.
Figure 8B:
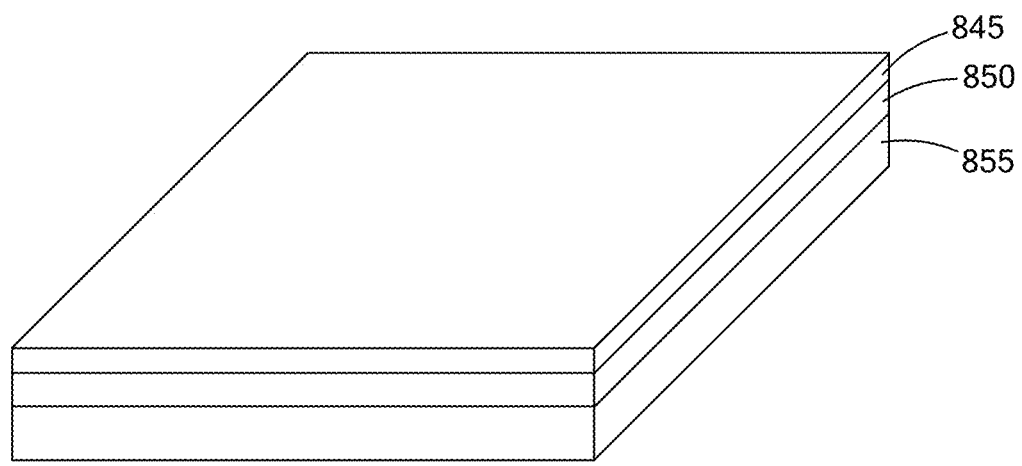

Next, the sacrificial layer 845 may be formed on the isolation layer 850, as shown schematically in FIG. 8B. A vapor deposition method such as electron beam evaporation or sputtering may be used. In this example, the sacrificial layer 845 comprises germanium deposited to a thickness of about 20 nm in thickness, although the thickness of the sacrificial layer 845 may more generally range from about 5 nm to about 50 nm, and other selectively etchable materials may be used.

Figure 8C:
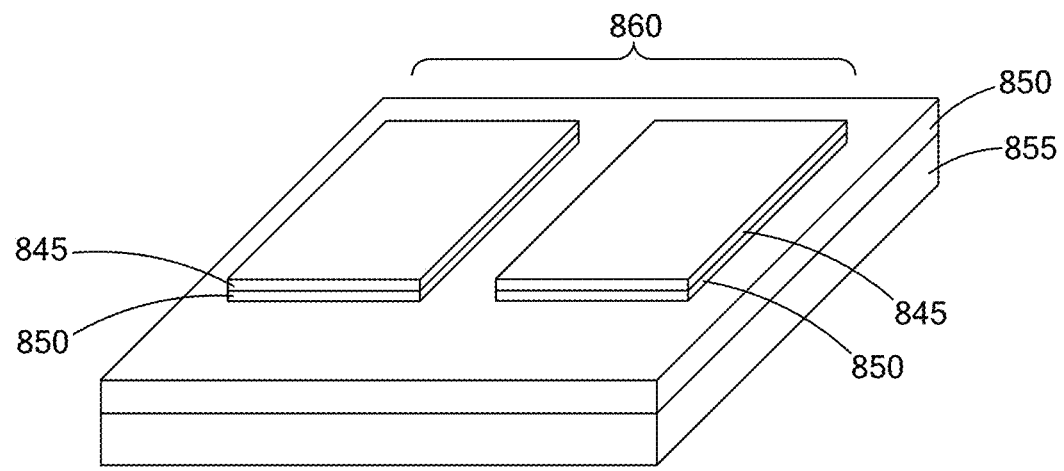

Optical lithography is used to define the desired substrate or stage pattern 860 followed by Freon reactive ion etching (RIE), or another suitable etching method, to remove unwanted portions of the sacrificial layer 845 and etch a considerable depth into the isolation layer 850, as illustrated in FIG. 8C.

Figure 8D:
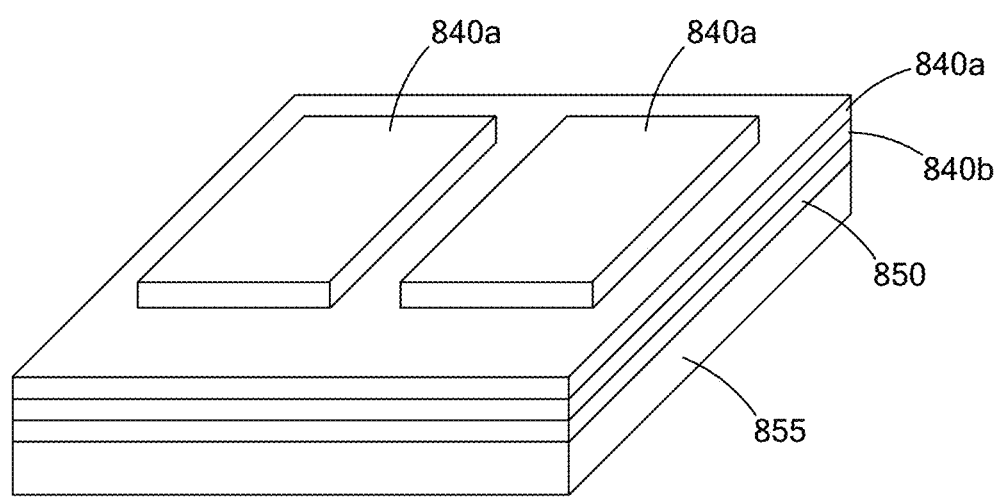
Figure 8E:
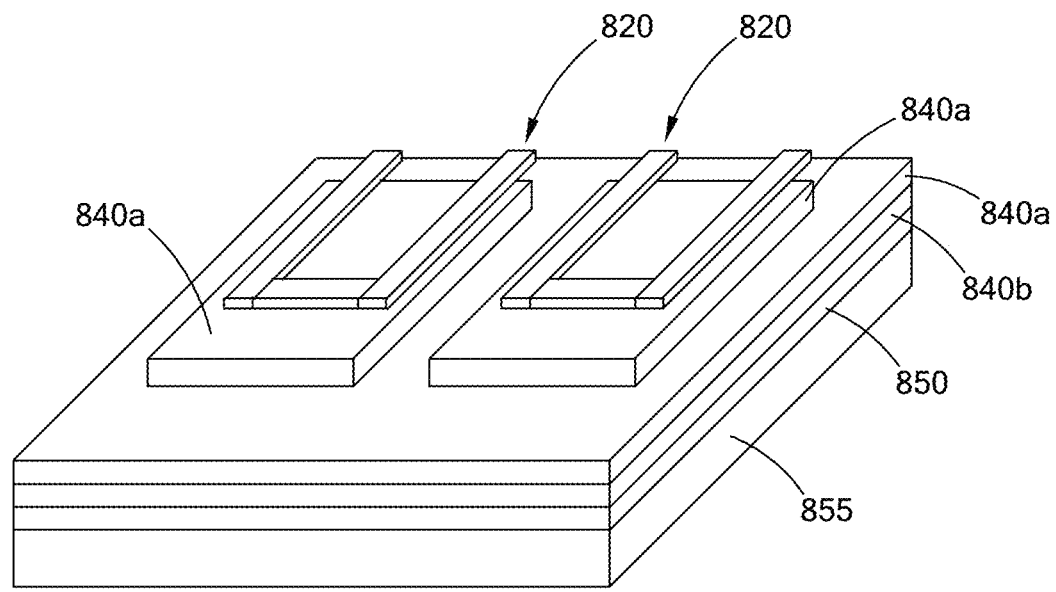

Referring to FIG. 8D, the next step is strained layer deposition, where low and high frequency PECVD are employed in sequence to deposit oppositely strained $SiN_x$ layers 840b, 840a. As shown in FIG. 8E, conductive strips (or generally speaking, the conductive pattern layer 820) may be formed by optical lithography followed by electron beam evaporation to deposit a nickel thin film of about 5 nm in thickness and a gold film of about 60 nm or more in thickness, followed by lift-off technology to remove unwanted portions of the metal layer.

Figure 8F:
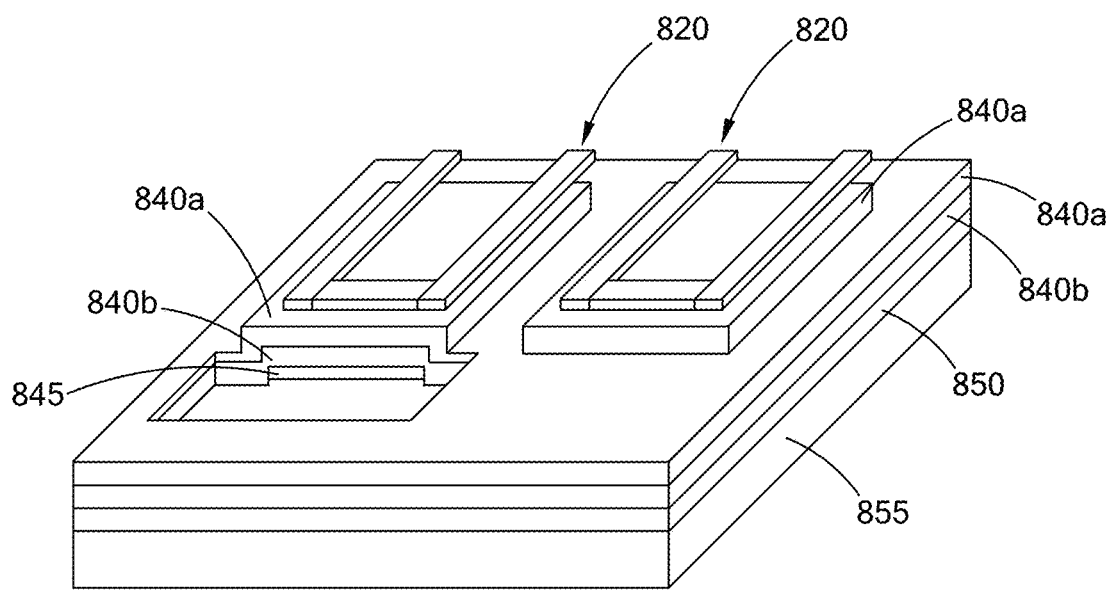

Optical lithography is employed for a third time to define window patterns, followed by Freon RIE to etch away the unwanted portions of the layers defined by the window patterns, thereby forming openings in the layers that allow access to the underlying sacrificial layer 845, as shown schematically in FIG. 8F. Finally, an appropriate etchant may be used to etch the sacrificial layer 845 and enable the strained layers 840a, 840b to be released and to roll up, as shown schematically in FIGS. 1C and 1D. For example, in the case of a Ge sacrificial layer 845, the wet etching may be carried out using 50 ml 30% hydrogen peroxide with 2 ml citric acid as the etchant at 90° C.

Figure 8G:
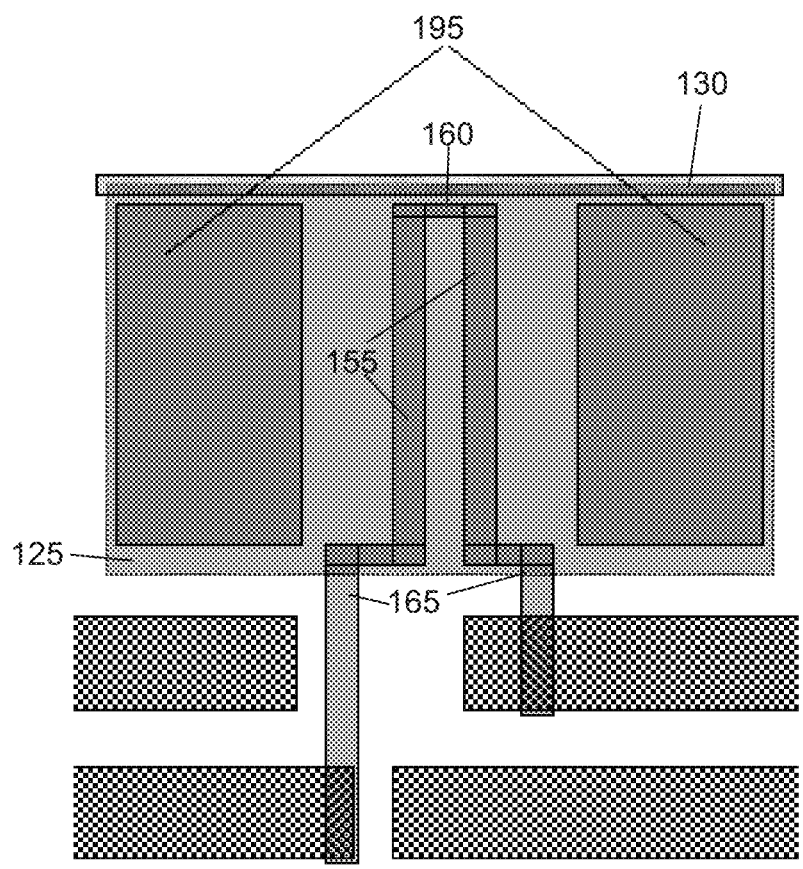
FIG. 8G illustrates the use of side support strips in fabrication.

FIG. 8G shows a top view of an exemplary conductive pattern layer comprising inductor cells 155 on a strained layer 125 prior to rolling, in which support film strips 195 are positioned outside the inductor cells 155 on the strained layer 125 to facilitate an even rolling process. This may be particularly advantageous when the length of the conductive strips 155 is long and the rolled configuration 110 includes a large number of turns. The support film strips 195 are typically located at least 50 microns away from the nearest inductor cells 155 and have no connection to the inductor cells 155. The support film strips 195 may be formed as part of the metal pattern layer and may have the same thickness as the conductive strips 155.

A rolled-up inductor structure for a RFIC may be formed by the above-described method. A standalone rolled-up inductor may have an even number of cells because its feedlines are typically located on the same side. However, a single-cell structure can be used together with other serially connected tube-based passive components. Such rolled-up device structures may further be transferred to a different substrate (e.g., via transfer printing), which may be a semiconductor wafer with predesigned RFICs. Transfer printing may allow high density packing of individual devices.

An exemplary transfer printing process uses a patterned polymeric (typically PDMS) stamp to selectively pick up nanostructures (in this case, rolled-up device structures) from their native substrates and deposit them in a desired layout onto functional substrates, without the use of adhesives. Such a process is described in U.S. Patent Application Publication 2013/0036928 (J. A. Rogers, P. Ferreira, and R. Saeidpourazar), entitled "Non-Contact Transfer Printing," which is hereby incorporated by reference. High density packing of rolled-up inductors and/or other rolled-up devices for a RFIC can be achieved using transfer printing. The technology has already been demonstrated at a commercial scale for solar cells (Semprius, Inc., Durham, N.C.).

Figure 9:
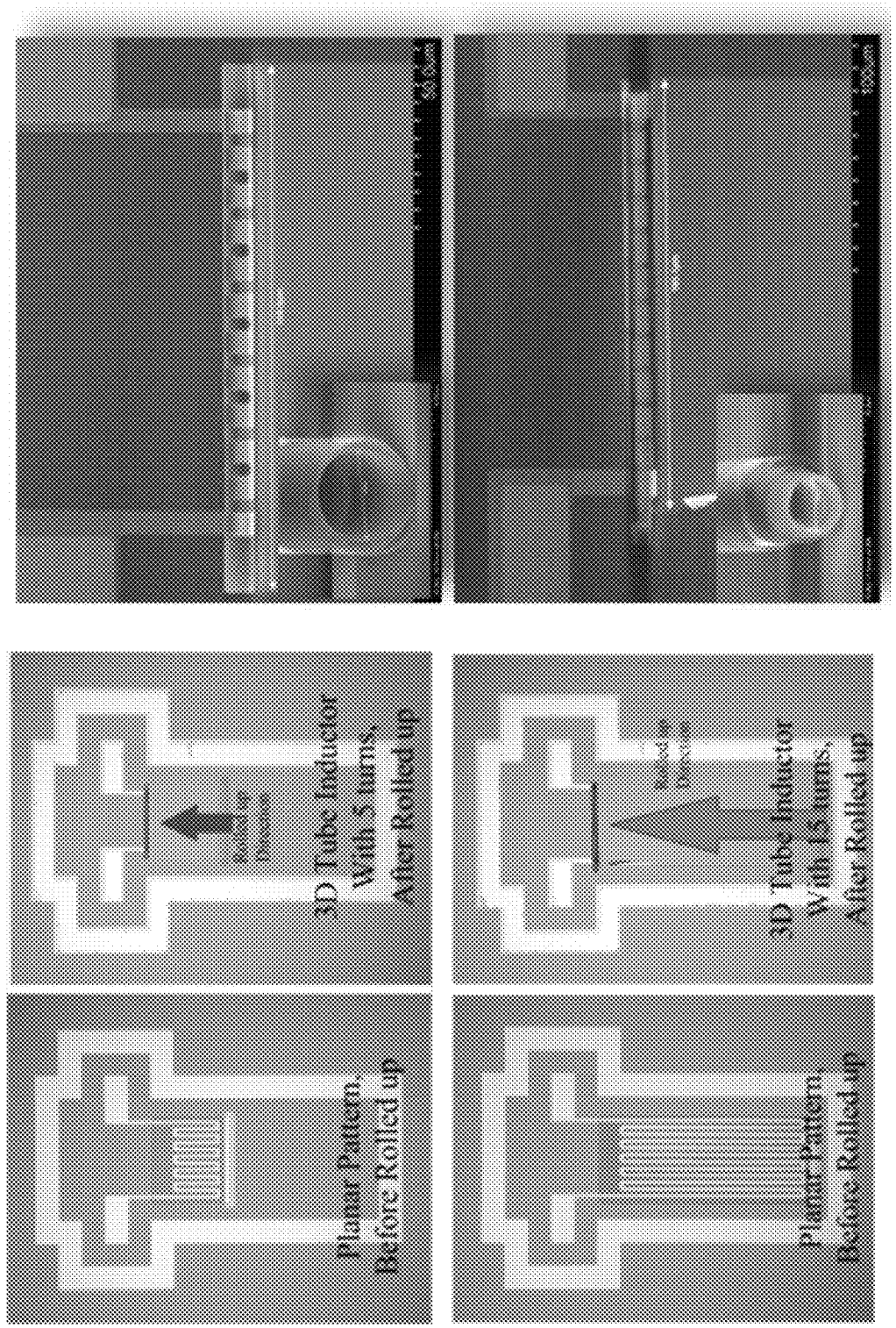
FIG. 9 shows optical (left) and SEM images (right) of 5-turn and 15-turn rolled-up inductors including 12 conductive strip (inductor cells) comprising gold (Au). The inner diameter of the rolled configuration is about 7 μm and the thickness of the Au conductive strips is about 30 nm.

To demonstrate the experimental feasibility and verify the modeled results, two inductor samples A and B were fabricated. The exemplary process involves the following sequential steps: depositing a Ge sacrificial layer using PVD; depositing a compressive strained $SiN_x$ layer on a Si substrate with thermal oxide ($SiO_2$) using low frequency (LF, 380 KHz) PECVD; patterning these two layers into a rectangular mesa; depositing a tensile strained $SiN_x$ layer using high frequency (HF, 13.56 MHz) PECVD; depositing a 30 nm thick Au film and patterning the Au film into desired conductive strips; opening a "window" from one side to expose the Ge sacrificial layer for etching and enable controlled directional rolling with the two feedlines exposed. Each sample used Ni (5 nm)/Au (30 nm)/Ni (5 nm) tri-metal-layers as the conduction layer and included 12 inductor cells separated by 5 μm between adjacent cells. The rolled-up inductor structures had an inner diameter of 7 μm and conductive strip widths of about 20 μm, as shown in FIG. 9.

Figure 10A:
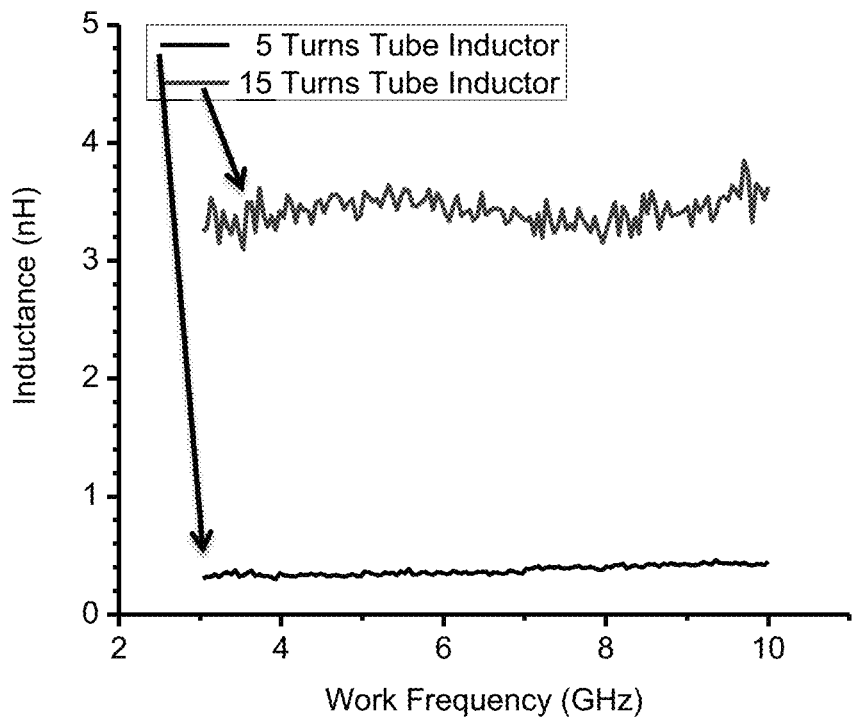
FIGS. 10A and 10B show RF experimental results for two rolled-up inductors that include 5 and 15 turns as indicated. All other geometric parameters for the two devices are the same: 12 inductor cells comprising Au, each cell being 20 microns in width and 30 nm in thickness. The cells are separated by Au connecting lines of about 5 microns in length, and the rolled-up inductor has an inner diameter of 7 microns.
Figure 10B:
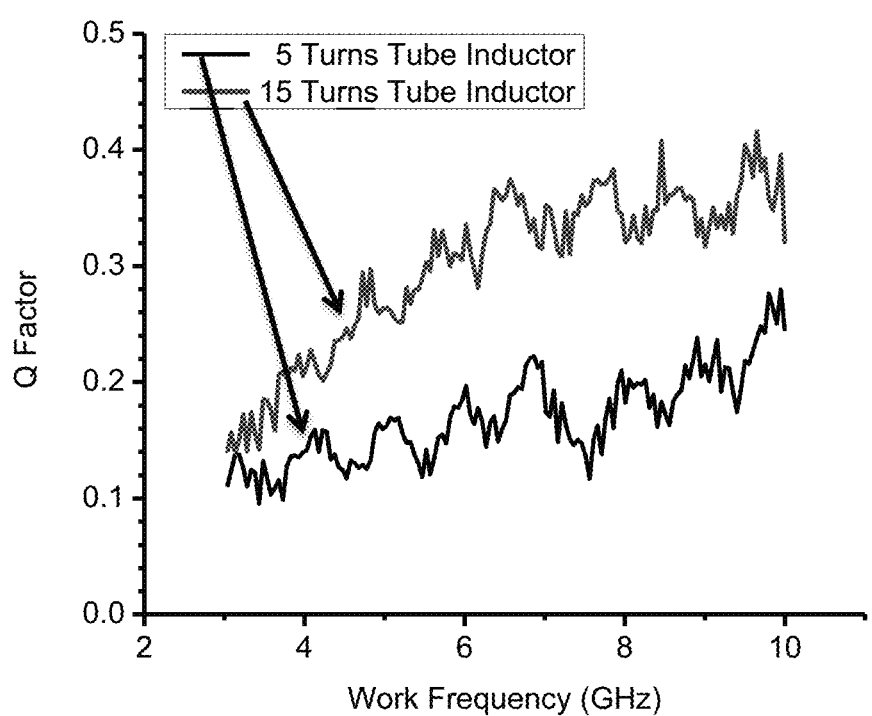

The numbers of turns are 5 and 15 and on-chip footprints are about 115×8 $\mu m^2$ and 295×10 $\mu m^2$ for samples A and B, respectively. FIGS. 10A and 10B show the inductance values and quality (Q) factors for each sample from 3 GHz to 10 GHz as measured using an Agilent HP 8510C Vector Network Analyzer (VNA). The measured inductance and maximum Q factors are ~0.4 nH, 0.24 (modeled values: 0.44 nH, 0.24) for Sample A; and 3.5 nH, 0.4 (modeled values: 4.4 nH, 0.4) for Sample B. The excellent consistency between the measured and modeled values confirms the validity of the analytical model. Note that the resistivity of the Au thin film is found to be from about 2 to 3.5 times larger than its bulk value for the best fitting. Even at this un-optimized stage, the best inductance density reaches 1.186 pH/$\mu m^2$ for Sample B which is ~19 times larger than its two-dimensional counterpart (10 nH, 400×400 $\mu m^2$ planar spiral inductor with $Q_{max}$~4 at 1 GHz).

Figure 11:
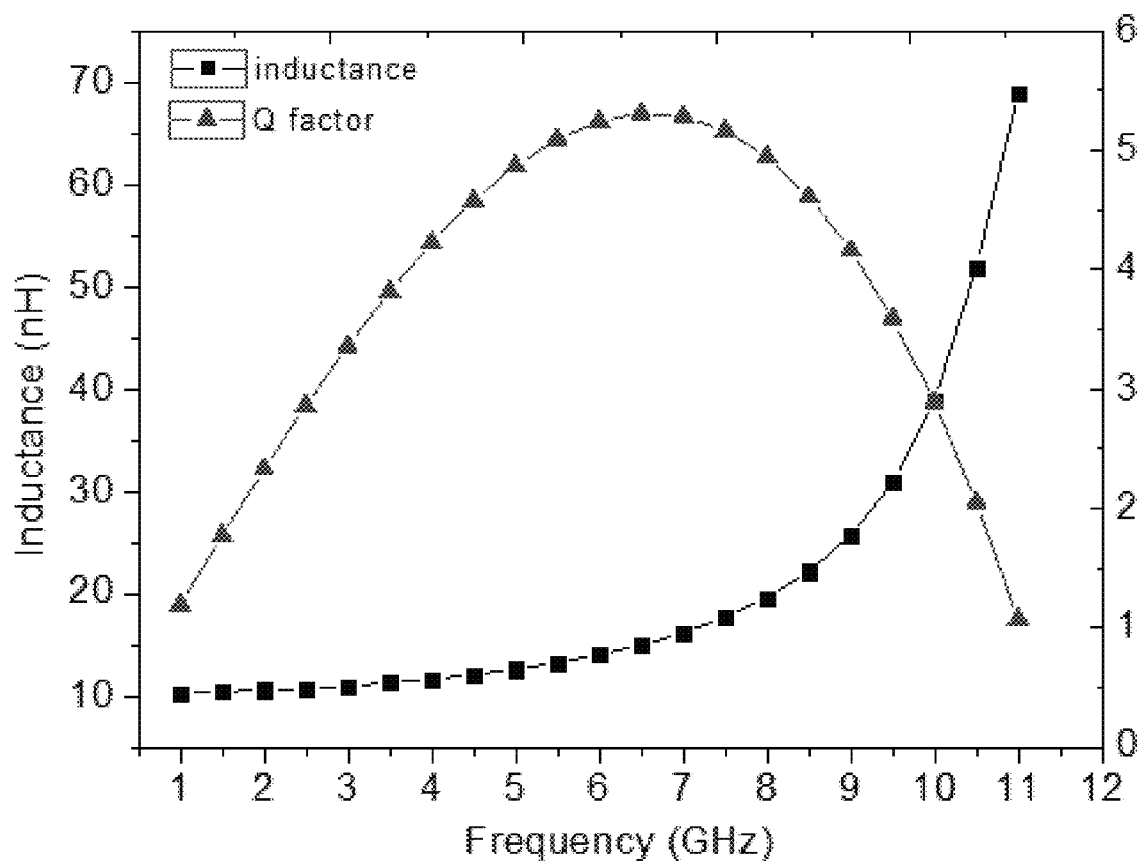
FIG. 11 shows the predicted performance of an optimized 26-turn, 2-cell inductor design based on experiments and the lumped circuit physical model, where each silver (Ag) conductive strip is assumed to be 100 nm in thickness and 15 microns in width with a resistivity two times larger than its bulk value. In addition, the spacing between cells is 15 microns and the inner diameter of the rolled-up inductor is 12 microns, including a $SiN_x$ sheet thickness of 41 nm.

The low Q factors measured are a direct indication of large ohmic loss. This issue can be addressed by using higher conductivity material, increasing the ratio of metal thickness to inner diameter, and rolling up more turns per cell. For example, a 2-cell design consisting of 100 nm thick, 15 μm wide Ag, with 12 μm inner diameter and 26-turns is predicted to have a maximum Q factor of about 5.5 with an inductance of about 10 nH and a resonance frequency of about 11 GHz (FIG. 11). The resonance frequencies of samples A and B are beyond 10 GHz, which confirms the benefit of the ultra-small occupation area and thus the corresponding reduced substrate parasitic capacitance.

Diverse applications have been proposed theoretically and some have been demonstrated experimentally, including III-V quantum dot microtube lasers, metamaterials based on arrays of gold/GaAs tubes, optical tube resonators integrated with silicon on insulator (Sol) waveguides, and biological sensors using microtube resonators. Recently, a metal (Ti/Cr)/insulator ($Al_2O_3$)/metal (Ti/Cr) tube capacitor structure has been demonstrated experimentally for ultracompact energy storage. These tube capacitors are almost two orders of magnitude smaller than their planar counterparts.

In conclusion, a novel design platform had been described for on-chip inductors based on strain-induced self-rolled-up nanotechnology, which produces 3D architectures through simply planar processing. Its 3D spiral architecture contributes directly to better confining the magnetic field and therefore enhancing the magnetic energy storage ability to obtain high inductance with dramatically smaller footprint and the related substrate parasitic capacitance. Experimental data on prototype tube inductor with a few turns show measured inductance consistent with designed values. In addition to inductors, rolled-up tube based capacitors and resistors can also be fabricated by this technology and integrated together with the rolled-up tube inductors for a super miniaturized passive RFIC platform.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein. Furthermore, the advantages described above are not necessarily the only advantages of the invention, and it is not necessarily expected that all of the described advantages will be achieved with every embodiment of the invention.

What is claimed is:

1. A rolled-up inductor structure for a radiofrequency integrated circuit (RFIC), the rolled-up structure comprising:
   a multilayer sheet in a rolled configuration comprising multiple turns about a longitudinal axis, the multilayer sheet comprising a conductive pattern layer on a strain-relieved layer,
   wherein the conductive pattern layer comprises:
      at least one conductive strip having a length extending in a rolling direction, the at least one conductive strip thereby wrapping around the longitudinal axis in the rolled configuration; and
      two conductive feed lines connected to the at least one conductive strip for passage of electrical current therethrough, wherein the two conductive feed lines extend away from the at least one conductive strip in a rolling direction, and
   wherein the conductive strip is an inductor cell of the rolled-up inductor structure.

2. The rolled-up inductor structure of claim 1, further comprising a plurality of the conductive strips disposed along the direction of the longitudinal axis and connected in series by connecting lines.

3. The rolled-up structure of claim 2 comprising n of the conductive strips, n being an even number from 2 to 20, and further comprising n−1 of the connecting lines.

4. The rolled-up inductor structure of claim 2, wherein a first connecting line connects a base of a first conductive strip to a top of a second conductive strip, and a second connecting line connects a base of the second inductor cell to a top of a third inductor cell, such that the electrical current passes through adjacent conductive strips in the same direction.

5. The rolled-up inductor structure of claim 4, wherein each of the connecting lines defines an angle θ with respect to a side of one of the conductive strips, the angle θ ranging from about 30° to about 60°.

6. The rolled-up inductor structure of claim 2, wherein a first connecting line connects a base of a first conductive strip to a base of a second conductive strip, and a second connecting line connects a top of the second conductive strip to a top of a third conductive strip, such that electrical current passes through adjacent conductive strips in opposing directions.

7. The rolled-up inductor structure of claim 6, wherein the connecting lines are aligned substantially parallel to the longitudinal axis.

8. The rolled-up inductor structure of claim 2, wherein the two conductive feed lines are connected to first and second ends of the plurality of the conductive strips.

9. The rolled-up inductor structure of claim 1, wherein the strain-relieved layer comprises two layers, and wherein, in an unrolled configuration of the multilayer sheet, a top layer of the two layers is in tension and a bottom layer of the two layers is in compression.

10. The rolled-up inductor structure of claim 9, wherein each of the two layers comprises non-stoichiometric silicon nitride.

11. The rolled-up inductor structure of claim 1, wherein the conductive pattern layer comprises one or more materials selected from the group consisting of carbon, silver, gold, aluminum, copper, molybdenum, tungsten, zinc, palladium, platinum, and nickel.

12. The rolled-up inductor structure of claim 1, wherein the conductive pattern layer comprises a thickness of from about 10 nm to about 100 nm.

13. The rolled-up inductor structure of claim 1, wherein a ratio of the thickness of the conductive pattern layer to an inner diameter of the rolled configuration of the multilayer sheet is at least about 0.005.

14. The rolled-up inductor structure of claim 1, wherein the rolled configuration of the multilayer sheet comprises at least about 10 turns.

15. The rolled-up inductor structure of claim 1, wherein the length of the at least one conductive strip is aligned substantially parallel to a rolling direction of the rolled configuration.

16. The rolled-up inductor structure of claim 1, wherein the rolled configuration of the multilayer sheet comprises an on-wafer footprint of about 5000 $\mu m^2$ or less.

17. A device comprising:
a plurality of the rolled-up inductor structures of claim 1 on a substrate, wherein the rolled-up inductor structures are components of a radiofrequency integrated circuit (RFIC), the substrate comprising a semiconductor.

18. A rolled-up inductor structure for a radiofrequency integrated circuit (RFIC), the rolled-up structure comprising:
a multilayer sheet in a rolled configuration comprising multiple turns about a longitudinal axis, the multilayer sheet comprising a conductive pattern layer on a strain-relieved layer,
wherein the conductive pattern layer comprises:
a plurality of conductive strips disposed along the direction of the longitudinal axis and connected in series by connecting lines, each of the conductive strips having a length extending in a rolling direction and wrapping around the longitudinal axis in the rolled configuration; and
two conductive feed lines connected to the plurality of conductive strips for passage of electrical current therethrough, wherein the two conductive feed lines are connected to first and second ends of the plurality of the conductive strips, and
wherein each of the conductive strips is an inductor cell of the rolled-up inductor structure.

19. The rolled-up inducture of claim 18, wherein a first connecting line connects a base of a first conductive strip to a base of a second conductive strip, and a second connecting line connects a top of the second conductive strip to a top of a third conductive strip, such that electrical current passes through adjacent conductive strips in opposing directions.

20. The rolled-up inductor structure of claim 18, wherein a first connecting line connects a base of a first conductive strip to a top of a second conductive strip, and a second connecting line connects a base of the second inductor cell to a top of a third inductor cell, such that the electrical current passes through adjacent conductive strips in the same direction.

* * * * *